(12) United States Patent
Khaderbad et al.

(10) Patent No.: US 12,315,863 B2
(45) Date of Patent: May 27, 2025

(54) CONTACT STRUCTURES IN SEMICONDUCTOR DEVICES

(71) Applicant: Taiwan Semiconductor Manufacturing Company, Ltd., Hsinchu (TW)

(72) Inventors: Mrunal Abhijith Khaderbad, Hsinchu (TW); Wei-Yen Woon, Hsinchu (TW); Cheng-Ming Lin, Kaohsiung (TW); Han-Yu Lin, Hsinchu (TW); Szu-Hua Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 405 days.

(21) Appl. No.: 17/533,575

(22) Filed: Nov. 23, 2021

(65) Prior Publication Data

US 2022/0310800 A1    Sep. 29, 2022

Related U.S. Application Data

(60) Provisional application No. 63/166,573, filed on Mar. 26, 2021.

(51) Int. Cl.
*H01L 21/67* (2006.01)
*H01L 21/285* (2006.01)
(Continued)

(52) U.S. Cl.
CPC ...... *H01L 29/401* (2013.01); *H01L 21/28518* (2013.01); *H01L 21/28525* (2013.01);
(Continued)

(58) Field of Classification Search
CPC ............ H01L 29/401; H01L 21/28518; H01L 21/28525; H01L 21/28568; H01L 29/41733; H01L 29/41791; H01L 29/42392; H01L 29/456; H01L 21/28562; H01L 21/2855; H01L 21/76844; H01L 21/76855; H01L 21/76846;
(Continued)

(56) References Cited

U.S. PATENT DOCUMENTS 9,461,134 B1 * 10/2016 Xie ................. H01L 23/291
9,711,396 B2 * 7/2017 Tang ................ H01L 21/285
(Continued)

FOREIGN PATENT DOCUMENTS

CN    105826257 A  *  8/2016  .......... H01L 21/266
CN    106206692 A  *  12/2016  ....... H01L 21/26586
(Continued)

*Primary Examiner* — Mohammed Shamsuzzaman
(74) *Attorney, Agent, or Firm* — Sterne, Kessler, Goldstein & Fox P.L.L.C.

(57) ABSTRACT

The present disclosure describes a semiconductor device and a method for forming the semiconductor device. The method includes forming a fin structure on a substrate, forming a gate structure on the fin structure, and forming a source/drain (S/D) region on the fin structure not covered by the gate structure. The method further includes forming a contact structure on the S/D region. Forming the contact structure includes forming a transition metal chalcogenide (TMC) layer on the S/D region, and forming a contact plug on the TMC layer.

20 Claims, 20 Drawing Sheets

(51) Int. Cl.
  *H01L 29/40*     (2006.01)
  *H01L 29/417*    (2006.01)
  *H01L 29/423*        (2006.01)
  *H01L 29/45*         (2006.01)

(52) U.S. Cl.
  CPC .. *H01L 21/28568* (2013.01); *H01L 29/41733* (2013.01); *H01L 29/41791* (2013.01); *H01L 29/42392* (2013.01); *H01L 29/456* (2013.01)

(58) Field of Classification Search
  CPC ......... H01L 21/76856; H01L 21/76897; H01L 23/485; H01L 29/0673; H01L 29/78696; H01L 29/45; H01L 29/66439; H01L 29/66795; H01L 29/775; H01L 29/785; H01L 29/161; H01L 29/165; H01L 29/7848; B82Y 10/00
  See application file for complete search history.

(56) References Cited

U.S. PATENT DOCUMENTS

| | | | | |
|---|---|---|---|---|
| 2016/0358916 | A1* | 12/2016 | Adusumilli | H01L 21/28518 |
| 2016/0372365 | A1* | 12/2016 | Tang | H01L 21/02175 |
| 2018/0151683 | A1* | 5/2018 | Yeo | H01L 29/0847 |
| 2018/0204840 | A1* | 7/2018 | Peng | H01L 21/3081 |
| 2018/0358474 | A1* | 12/2018 | Li | H01L 29/42356 |
| 2020/0126987 | A1* | 4/2020 | Rubin | H01L 29/0847 |
| 2020/0144405 | A1* | 5/2020 | Yun | H01L 29/66969 |
| 2020/0287020 | A1* | 9/2020 | Seo | H01L 29/78696 |
| 2020/0350215 | A1* | 11/2020 | Zhang | H01L 21/0262 |
| 2020/0388685 | A1* | 12/2020 | Sharma | H01L 29/785 |
| 2021/0005450 | A1* | 1/2021 | Mattinen | H01L 21/02568 |
| 2021/0242317 | A1* | 8/2021 | Gu | H01L 29/41791 |
| 2022/0293736 | A1* | 9/2022 | Khaderbad | H01L 29/66969 |
| 2023/0023186 | A1* | 1/2023 | Lin | H01L 29/1606 |
| 2023/0197836 | A1* | 6/2023 | Naylor | H01L 29/7606 257/29 |

FOREIGN PATENT DOCUMENTS

| | | | | |
|---|---|---|---|---|
| CN | 105322018 B | * | 5/2019 | ......... H01L 27/0924 |
| CN | 109860145 A | * | 6/2019 | ....... H01L 21/76224 |
| CN | 105826190 B | * | 8/2019 | ....... H01L 21/02142 |
| DE | 102017103499 A1 | * | 5/2018 | ..... H01L 21/823418 |
| DE | 102020116641 A1 | * | 6/2021 | ....... H01L 21/02568 |
| TW | 201428975 A | * | 7/2014 | ......... H01L 21/0257 |
| TW | 202301478 A | * | 1/2023 | ......... H01L 29/1054 |
| WO | WO-2019054989 A1 | * | 3/2019 | ....... H01L 21/28061 |

* cited by examiner

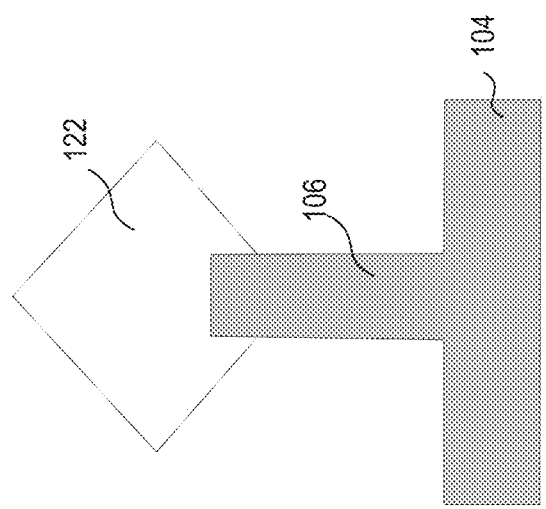
FIG. 1C
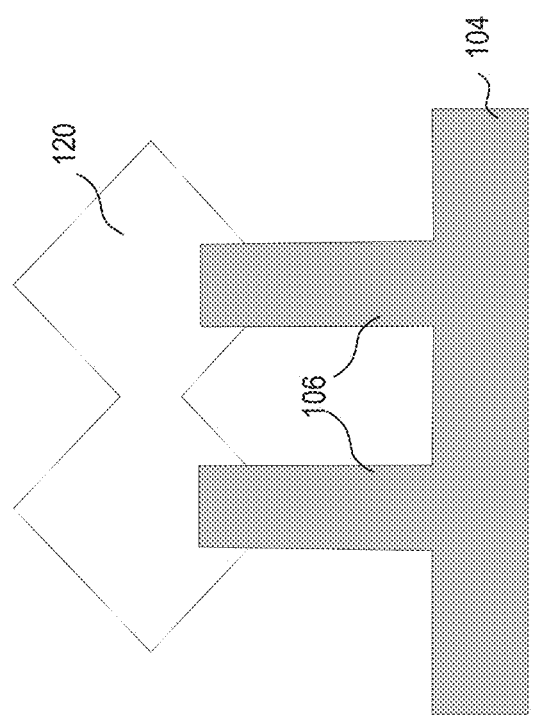
FIG. 1B
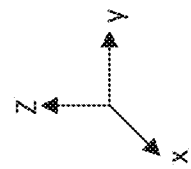

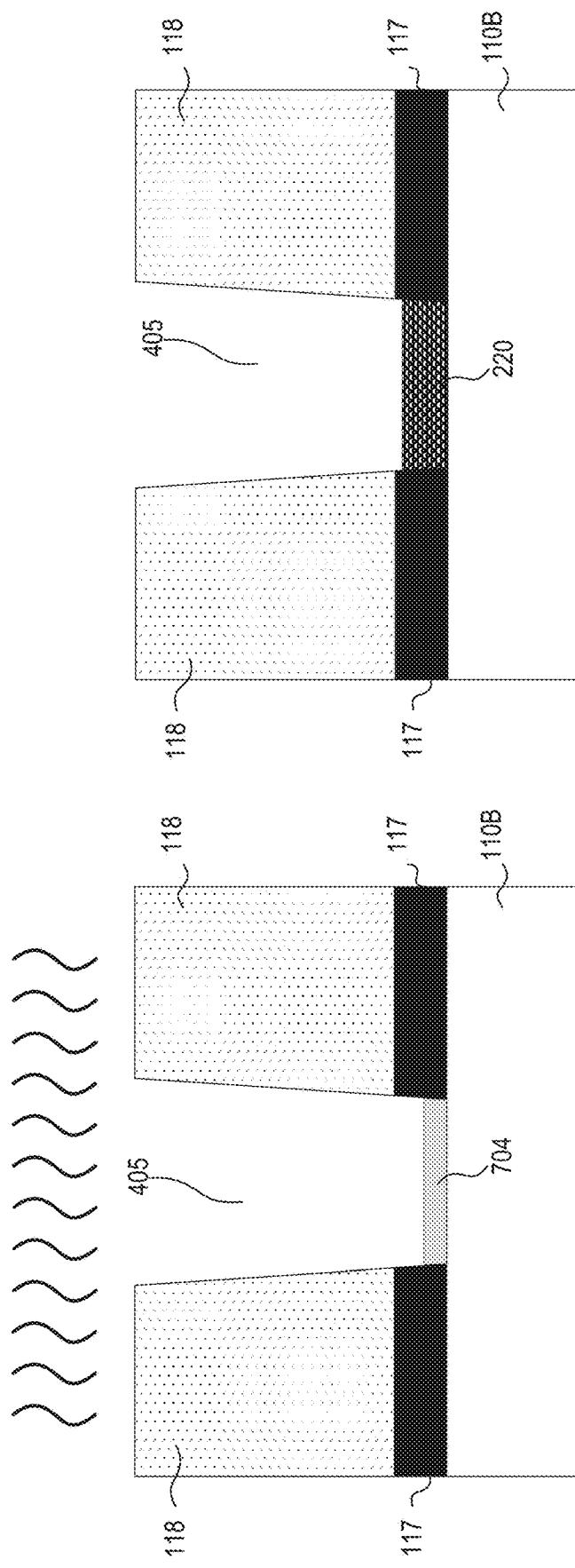

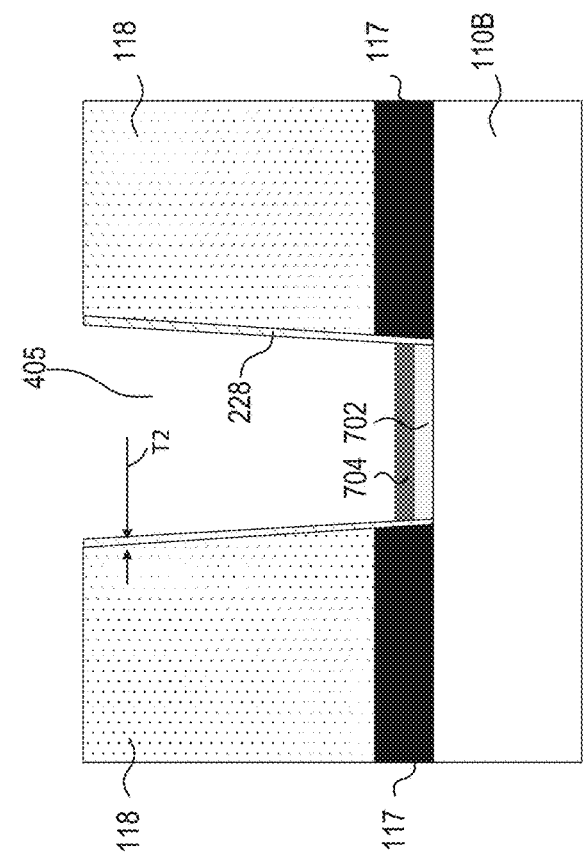
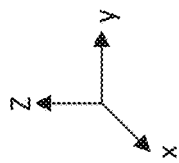
FIG. 9B
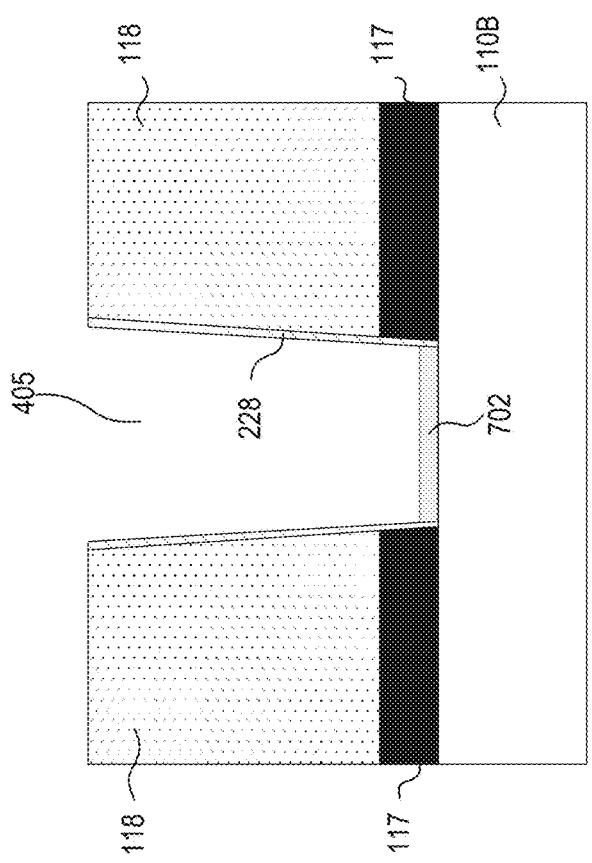
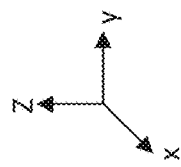
FIG. 9A

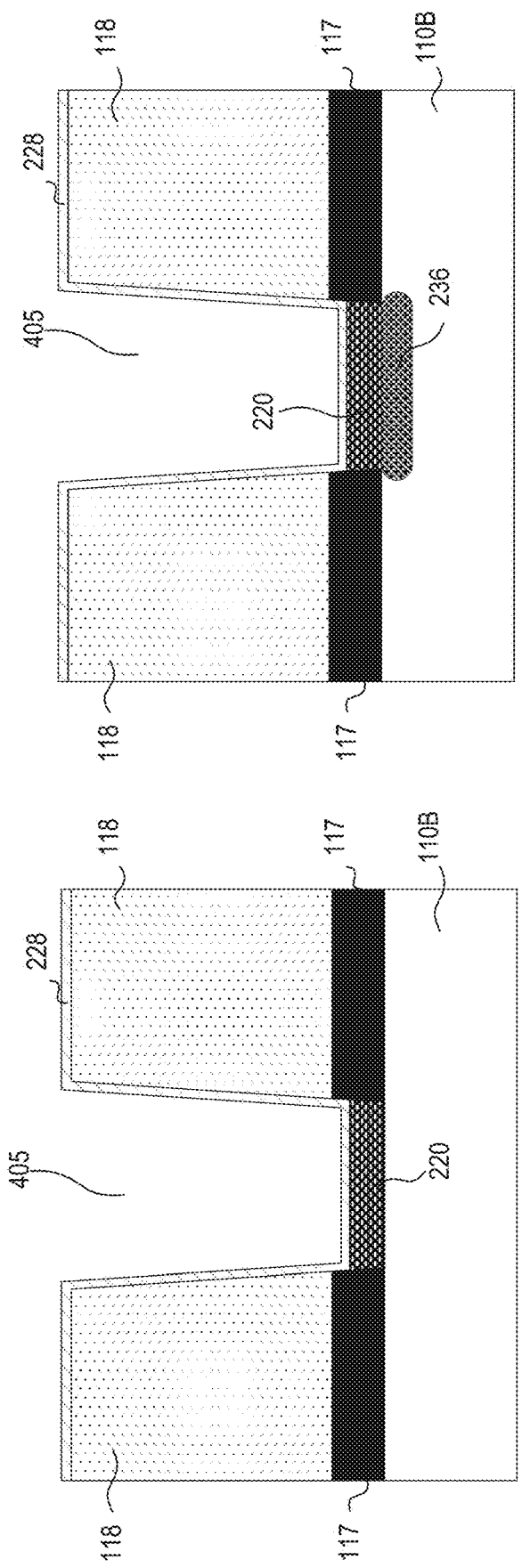
FIG. 10A
FIG. 10B

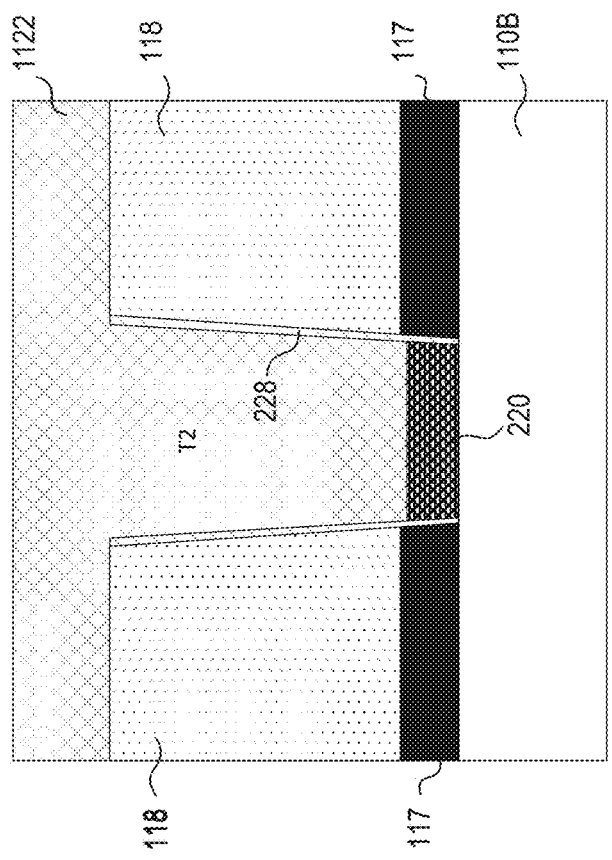
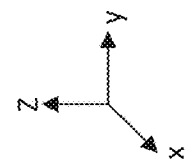
FIG. 11A
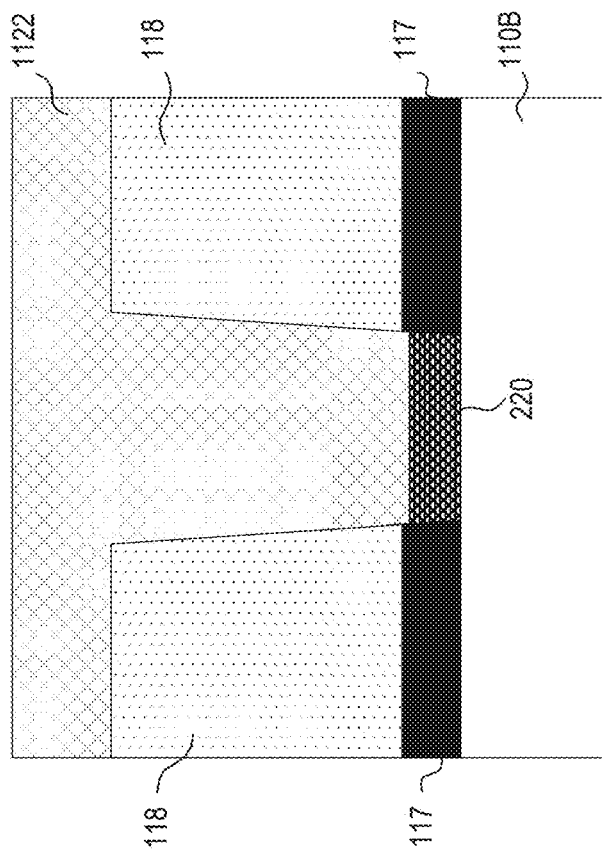
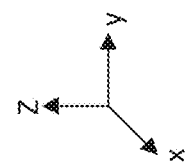
FIG. 11B

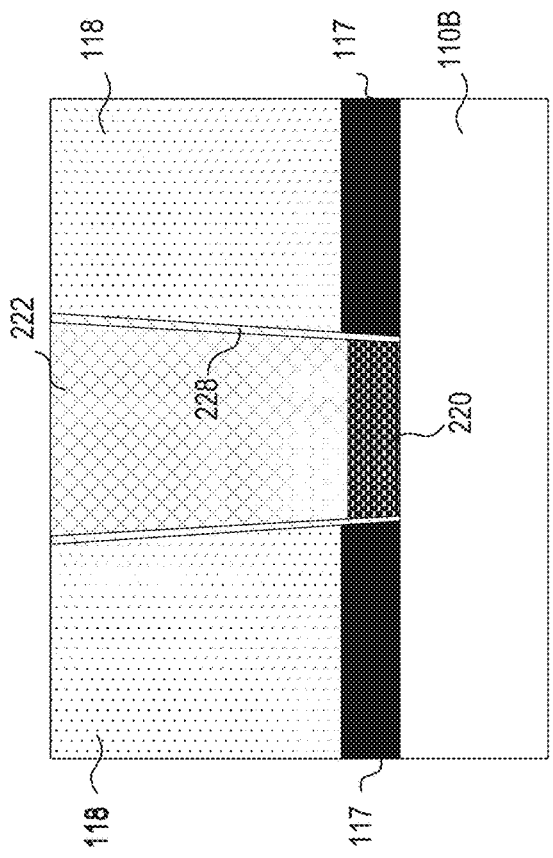
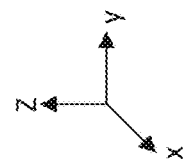
FIG. 12B
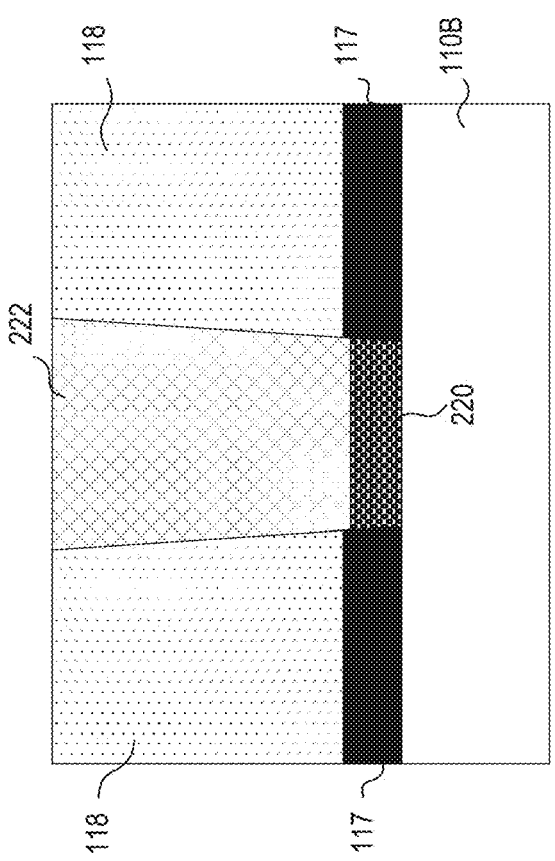
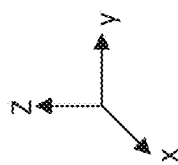
FIG. 12A

CONTACT STRUCTURES IN SEMICONDUCTOR DEVICES

CROSS-REFERENCE TO RELATED APPLICATION

This application claims the benefit of U.S. Provisional Patent Application No. 63/166,573, filed on Mar. 26, 2021 and titled "Method of SBH Reduction Layer Insertion for Low Resistance Contacts," the disclosure of which is incorporated by reference herein in its entirety.

BACKGROUND

The performance of integrated circuits (ICs) can depend on the resistances of contacts, vias, and interconnects. Contact resistance may be impacted by contact resistivity between source/drain (S/D) regions and S/D contacts because of high Schottky barrier height (SBH). Contact resistance may be further impacted by liner resistivity and scattering from surfaces between different layers. Metal silicides may be formed between the S/D regions and the S/D contacts, but there are manufacturing challenges to find thermally stable n-type silicides on n-type S/D regions and p-type silicides on p-type S/D regions.

BRIEF DESCRIPTION OF THE DRAWINGS

Aspects of the present disclosure are best understood from the following detailed description when read with the accompanying figures.

FIGS. 1B and 1C illustrate cross-sectional views of a semiconductor device, in accordance with some embodiments.

FIGS. 4-5, 6A-6B, and 7A-7C, 8A-8B, 9A-9C, 10A-10B, and 11A-12D illustrate cross-sectional views of a semiconductor device with contact structures at various stages of its fabrication process, in accordance with some embodiments.

DETAILED DESCRIPTION

Figure 1A:
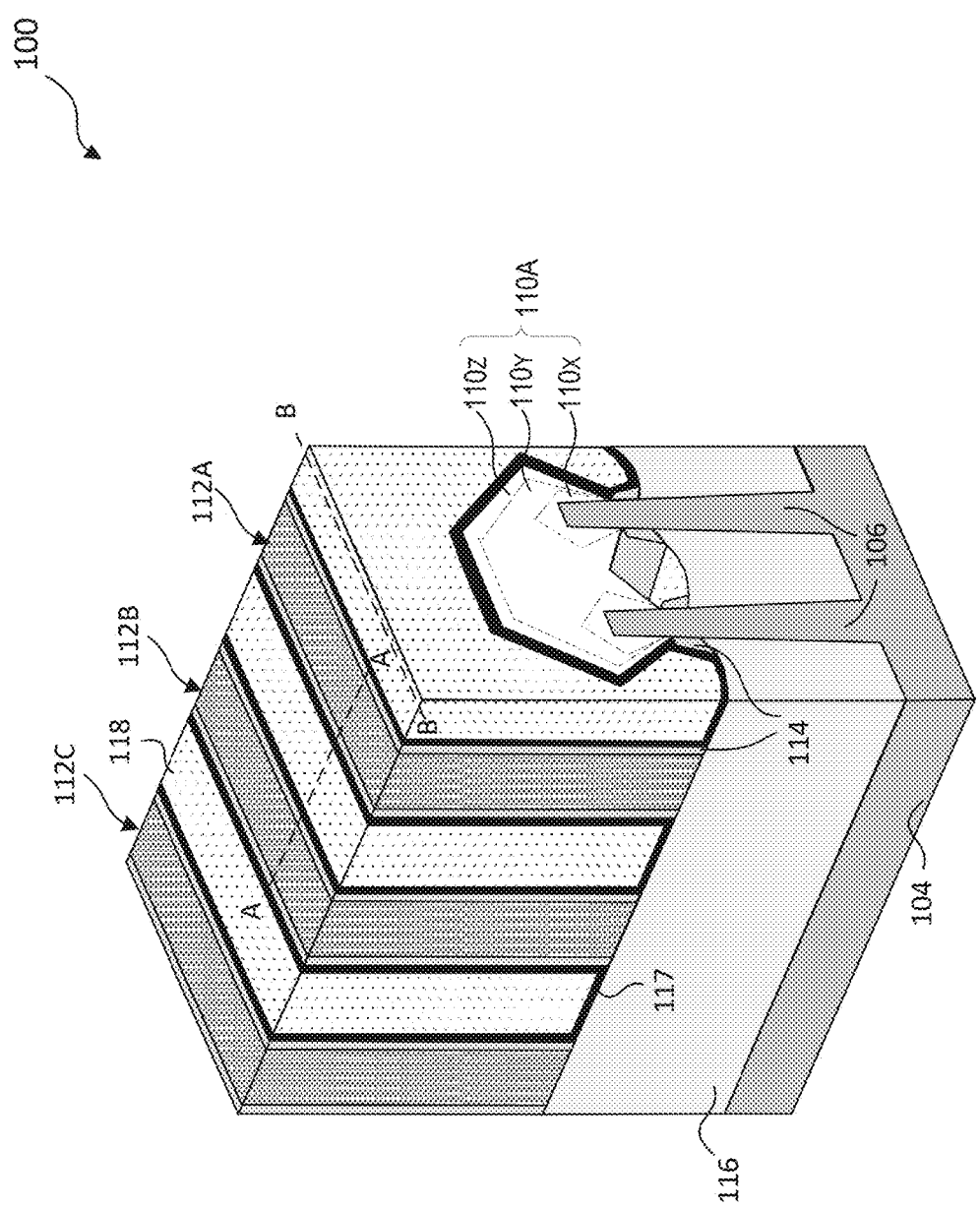
FIG. 1A illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The discussion of elements in FIGS. 1A-1C, 2A-2I, 4-5, 6A-6B, 7A-7C, 8A-8B, 9A-9C, 10A-10B, and 11A-12D with the same annotations applies to each other, unless mentioned otherwise.

High Schottky barrier height (SBH) between source/drain (S/D) regions and S/D contact structures contributes to high contact resistance. Other factors include liner resistivity and scattering from surfaces between different layers. Metal silicides can be formed between the S/D regions and the S/D contact structures to reduce SBH, but there are manufacturing challenges to find thermally stable n-type silicides on n-type S/D regions and p-type silicides on p-type S/D regions.

The present disclosure provides example semiconductor devices (e.g., finFETs, gate-all-around (GAA) FETs, and/or MOSFETs) with S/D contact structures having SBH reduction layers to achieve low contact resistance and a method for forming such semiconductor devices. In some embodiments, the SBH reduction layers are disposed between S/D regions and S/D contact plugs to reduce contact resistance and eliminate the formation of metal silicide layer to reduce consumption of the material of S/D regions. In some embodiments, the SBH reduction layers include a transition metal chalcogenide (TMC) material.

In some embodiments, the SBH reduction layer can be formed by depositing a layer of chalcogen material, e.g., sulfur (S), selenium (Se), or tellurium (Te), on the S/D region and then depositing a layer of transition metal, e.g., titanium (Ti), tungsten (W), or molybdenum (Mo). The two layers can diffuse together and form the TMC material of the SBH reduction layer. The TMC layer can generate a gradient transition of semiconductor-semimetal-metal from the S/D region to the S/D contact plugs, thus reducing the SBH, i.e., SBH tuning.

In some embodiments, the SBH reduction layer can be formed by depositing a layer of transition metal, such as Ti, W, or Mo on the S/D region, and then treat the transition metal layer with a chalcogen material, such as S- or Se-based gas. In both methods of forming the SBH reduction layer, S or Se terminated bonds at the interface between the S/D region and the SBH reduction layer can reduce band gap and reduce resistivity. On the other hand, transition metal terminated bonds at the interface between the S/D contact plugs and the SBH reduction layer can reduce contact resistivity.

In some embodiments, a liner layer can be formed on sidewalls of the S/D contact plugs. In some embodiments, a liner layer can be formed on the SBH reduction layer. The liner layer can have conductive materials, e.g., titanium sulfide ($TiS_2$). The liner layer can decrease elastic scattering and improve conductivity. With the use of SBH reduction layers, thinner and higher-conductivity liners, and in some embodiments, metal silicides, the contact resistance can be reduced. The fabrication process for the SBH reduction layer can use a low temperature catalyst assisted growth, which reduces the challenges of the manufacturing process in achieving low contact resistance.

According to some embodiments, FIG. 1A illustrates an isometric view of a FET 100. In some embodiments, FET 100 can represent a finFET 100 or a GAA FET 100. In some embodiments, FET 100 can represent n-type FET 100 (NFET 100) or p-type FET 100 (PFET 100) and the discussion of FET 100 applies to both NFET 100 and PFET 100, unless mentioned otherwise. FIGS. 1B-1C illustrate cross-sectional views of S/D regions on fin structures, according to some embodiments. FIGS. 2A, 2C, 2E, 2G, and 2I illustrate cross-sectional views of FET 100 along line A-A with additional structures that are not shown in FIG. 1A for simplicity. FIGS. 2B, 2D, 2F, and 2H illustrate cross-sectional views of FET 100 along line B-B with additional structures that are not shown in FIG. 1A for simplicity. The discussion of elements in FIGS. 1A-1C and 2A-2I with the same annotations applies to each other, unless mentioned otherwise.

FET 100 can include an array of gate structures 112A-112C disposed on a fin structures 106 and an array of S/D regions (only one S/D region 110A is visible in FIG. 1A; S/D region 110B visible in 2A, 2C, 2E, 2G, and 2I) disposed on portions of fin structures 106 that are not covered by gate structures 112A-112C. FET 100 can further include gate spacers 114 and shallow trench isolation (STI) regions 116. FET 100 can further include etch stop layers (ESLs) 117, and interlayer dielectric (ILD) layers 118. ILD layer 118 can be disposed on ESLs 117. In some embodiments, gate spacers 114, STI regions 116, ESLs 117A, and ILD layers 118 can include an insulating material, such as silicon oxide ($SiO_x$), silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112A-112C from adjacent structures.

FET 100 can be formed on a substrate 104. There can be other FETs and/or structures (e.g., isolation structures) formed on substrate 104. Substrate 104 can be a semiconductor material, such as silicon (Si), germanium (Ge), silicon germanium (SiGe), a silicon-on-insulator (SOI) structure, and/or a combination thereof. Further, substrate 104 can be doped with p-type dopants, e.g., boron (B), indium (In), aluminum (Al), or gallium (Ga), or n-type dopants, e.g., phosphorus (P) or arsenic (As). In some embodiments, fin structures 106 can include a material similar to substrate 104 and extend along an x-axis.

According to some embodiments, FIGS. 1B and 1C are cross-sectional views of S/D regions on fin structures 106. In some embodiments as shown in FIG. 1A, two adjacent epitaxially grown regions can form a merged S/D region 110A on fin structures 106 with a substantially flat top surface. In some embodiments as shown in FIG. 1B, two adjacent epitaxially grown regions can form a merged S/D region 120 on fin structures 106 with a non-flat top surface. In some embodiments as shown in FIG. 1C, one epitaxially grown region can form a S/D region 122 on fin structure 106 with a non-flat top surface. S/D contact structures can be formed on S/D regions 110A, 120, and 122. SBH reduction layers can be interposed between S/D contact structures and S/D regions 110A, 120, and 122, to reduce contact resistance. A liner layer can be disposed to reduce surface scattering and further reduce the contact resistance. In some embodiments, a metal silicide can be formed in S/D regions 110A, 120, and 122 to further reduce the SBH between S/D regions 110A, 120, and 122 and the S/D contact structures.

Figure 2B:
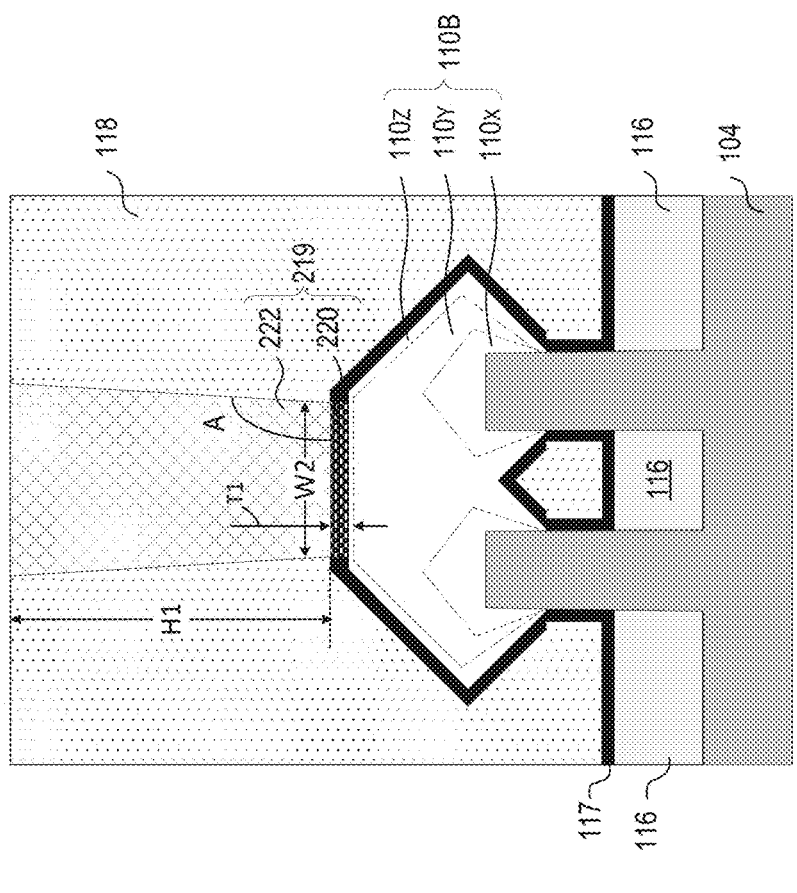
FIGS. 2A-2I illustrate cross-sectional views of a semiconductor device with contact structures, in accordance with some embodiments.
Figure 2A:
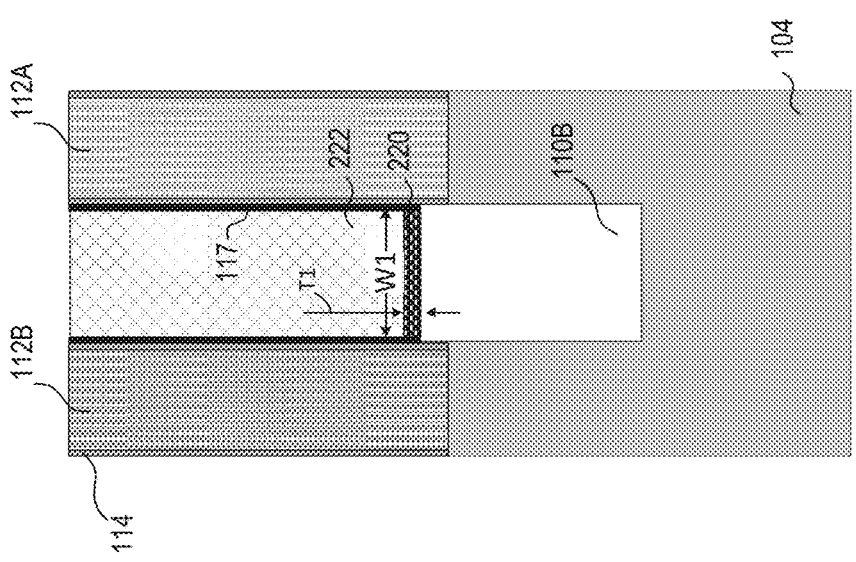

Referring to FIGS. 1A and 2A, in some embodiments, gate structures 112A-112C can be multi-layered structures. The multi-layers of gate structures 112A-112C are not shown for simplicity. Each of gate structures 112A-112C can include an interfacial oxide (IO) layer, a high-k (HK) gate dielectric layer disposed on IO layer, and a conductive layer disposed on HK gate dielectric layer. IO layers can include $SiO_x$, silicon germanium oxide ($SiGeO_x$), or germanium oxide ($GeO_x$). HK gate dielectric layers can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). Conductive layers can be multi-layered structures. Each of conductive layers can include a work function metal (WFM) layer disposed on HK dielectric layer, and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped Ti, Al-doped titanium nitride (TiN), Al-doped tantalum (Ta), Al-doped tantalum nitride (TaN), other suitable Al-based materials, or a combination thereof. In some embodiments, the WFM layers can include substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. The gate metal fill layers can include a suitable conductive material, such as W, Ti, silver (Ag), ruthenium (Ru), Mo, copper (Cu), cobalt (Co), Al, iridium (Ir), nickel (Ni), metal alloys, and a combination thereof.

Referring to FIGS. 1A and 2A-2B, for NFET 100, each of S/D regions 110A-110B can include an epitaxially-grown semiconductor material, such as Si, and n-type dopants, such as P and other suitable n-type dopants. For PFET 100, each of S/D regions 110A-110B can include an epitaxially-grown semiconductor material, such as Si and SiGe, and p-type dopants, such as B and other suitable p-type dopants.

Referring to FIGS. 1A and 2B, in some embodiments, S/D regions 110A-110B can have a plurality of sub-regions 110x-110z that can include SiGe and can differ from each other based on, for example, doping concentration, epitaxial growth process conditions and/or relative concentration of Ge with respect to Si. Each of sub-regions 110x-110z can have thicknesses similar to or different from each other and thicknesses can range from about 0.5 nm to about 5 nm. In some embodiments, the atomic percent Ge in a first sub-region 110x can be smaller than the atomic percent Ge in a second sub-region 110z. In some embodiments, sub-region 110x can include Ge in a range from about 15 atomic percent to about 35 atomic percent, while sub-region 110z can include Ge in a range from about 25 atomic percent to about 50 atomic percent with any remaining atomic percent being Si in the sub-regions. The plurality of sub-regions 110x-110z can have varying p-type dopant concentrations with respect to each other, according to some embodiments. For example, sub-region 110x can be undoped or can have a dopant concentration lower (e.g., dopant concentration less than about $8 \times 10^{20}$ atoms/cm$^3$) than the dopant concentration (e.g., dopant concentration in a range from about $1 \times 10^{20}$ to about $3 \times 10^{22}$ atoms/cm$^3$) of sub-region 110z.

In some embodiments, sub-region 110x can have materials with silicon arsenic (SiAs), SiC, or silicon carbon phosphide (SiCP), a dopant concentration ranging from about $1 \times 10^{20}$ atoms/cm$^3$ to about $1 \times 10^{21}$ atoms/cm$^3$ and a thickness ranging from about 1 nm to about 3 nm. Sub-region 110y disposed on sub-region 110x can have materials with SiP and a dopant concentration ranging from about $1 \times 10^{20}$ atoms/cm$^3$ to about $1 \times 10^{22}$ atoms/cm$^3$. Sub-region 110z disposed on sub-region 110y can have materials with material compositions and thicknesses similar to sub-region 110x.

By way of example and not limitation, epitaxial S/D regions 110A-110B can be grown using source gases, such as silane (SiH$_4$), silicon tetrachloride (SiCl$_4$), trichlorosilane (TCS), and dichlorosilane (SiH$_2$Cl$_2$ or DSC). Hydrogen (H$_2$) can be used as a reactant gas to reduce the aforementioned source gases. The growth temperature during the epitaxial growth can range from about 700° C. to about 1250° C. depending on the gases used. For example, source gases with fewer chlorine atoms (e.g., like DSC) can require lower formation temperatures compared to source gases with more chlorine atoms, such as SiCl$_4$ or TCS. According to some embodiments, epitaxial S/D regions 110A-110B can inherit the same crystallographic orientation as semiconductor substrate 104 or fin structures 106 since semiconductor substrate 104 effectively functions as a seed layer for epitaxial S/D regions 110A-110B. This means that top surface of epitaxial S/D regions 110A-110B can also be parallel to the (100) crystal plane. In some embodiments, two adjacent epitaxial regions can form a combined flat top surface similar to the one shown in FIGS. 1A, 2B, 2D, 2F, and 2H. In some embodiments, two adjacent epitaxial regions can form a combined non-flat top surface similar to the one shown in FIG. 1B.

Referring to FIGS. 2A-2B, FET 100 can further include a S/D contact structure 219 disposed on S/D region 110B. Similar S/D contact structures 219 can be disposed on S/D regions 110A and 110C. In some embodiments, S/D contact structure 219 can include a SBH reduction layer 220 disposed on S/D region 110B and a contact plug 222 disposed on SBH reduction layer 220.

In some embodiments, contact plug 222 can include conductive materials with low resistivity (e.g., resistivity about 50 μΩ-cm, about 40 μΩ-cm, about 30 μΩ-cm, about 20 μΩ-cm, or about 10 μΩ-cm), such as Co, W, Ru, Ir, Ni, osmium (Os), rhodium (Rh), Al, Mo, Ti, other suitable conductive materials with low resistivity, and a combination thereof. A S/D contact opening 405 (shown in FIG. 5) can be formed first in ILD layer 118 and ESL 117 before contact plug 222 is formed within S/D contact opening 405. In some embodiments, width W1 can range from about 10 nm to about 30 nm, width W2 can range from about 10 nm to about 200 nm, height H1 can range from about 20 nm to about 100 nm, and slant angle A can range from about 80 degrees to about 90 degrees. In some embodiments, a ratio W1:W2 can range from about 1:1 to about 1:10. These dimension ranges and ratios of contact plug 222 provide an optimal contact area between S/D region 110B and overlying interconnect structures (not shown) without compromising device size and manufacturing cost.

SBH reduction layer 220 provides a low resistive interface between contact plug 222 and S/D region 110B. Without SBH reduction layer 220, the direct contact between contact plug 222 and S/D region 110B can result in a high semiconductor-metal SBH, and consequently in high contact resistance. In some embodiments, the use of SBH reduction layer 220 can eliminate the use of silicide layer between contact plug 222 and S/D region 110B.

In some embodiments, SBH reduction layer 220 can include a transition metal chalcogenide (TMC) material, such as a sulfide of any of the transition metals of the periodic table, a selenide of any of the transition metals of the periodic table, a telluride of any of the transition metals of the periodic table, an oxide of any of the transition metals of the periodic table, or a combination thereof. In some embodiments, the TMC material can include tungsten sulfide (WS$_2$), tungsten selenide (WSe$_2$), tungsten telluride (WTe$_2$), molybdenum sulfide (MoS$_2$), molybdenum selenide (MoSe$_2$), molybdenum telluride (MoTe$_2$), TiS$_2$, titanium selenide (TiSe$_2$), titanium telluride (TiTe$_2$), zirconium sulfide (ZrS$_2$), zirconium selenide (ZrSe$_2$), zirconium telluride (ZrTe$_2$), tantalum sulfide (TaS$_2$), tantalum selenide (TaSe$_2$), tantalum telluride (TaTe$_2$), nickel sulfide (NiS$_2$), nickel selenide (NiSe$_2$), nickel telluride (NiTe$_2$), cobalt sulfide (CoS$_2$), cobalt selenide (CoSe$_2$), cobalt telluride (CoTe$_2$), niobium sulfide (NbS$_2$), niobium selenide (NbSe$_2$), niobium telluride (NbTe$_2$), hafnium sulfide (HfS$_2$), hafnium selenide (HfSe$_2$), hafnium telluride (HfTe$_2$), or a combination thereof. In some embodiments, for n-type S/D region 110B, the TMC material of SBH reduction layer 220 can include MoS$_2$, WS$_2$, zirconium hafnium sulfide selenide (Zr(Hf)S (Se)$_2$), MoTe$_2$, WTe$_2$, or TaTe$_2$. In some embodiments, for p-type S/D region 110B, the TMC material of SBH reduction layer 220 can include MoSe$_2$ (if Ge concentration less than about 25% in S/D region 110B), $WSe_2$, $MoTe_2$, $WTe_2$, $TiTe_2$, $HfTe_2$, $NbSe_2$, $TaSe_2$, $TiS_2$, or $TaS_2$.

The TMC material can include a composition of $M_xS_y$, $M_xSe_y$, and/or $M_xTe_y$, where M is a metal and the ratio between y value and x value can range from about 1.2:1 to about 2.1:1. In some embodiments, the atomic concentration of oxygen (O), chlorine (Cl), and/or fluorine (F) in the TMC material can be about 0% to about 30%. In some embodiments, the atomic concentration of S or Se in the TMC material can be about 40% to about 66%. In some embodiments, the atomic concentration of a transition metal in the TMC material can be about 20% to about 33%. The TMC material can create a semiconductor-semimetal-metal work function (WF) transition from S/D region 110B to S/D contact plug 222. The transition can reduce SBH, i.e., SBH tuning, between S/D region 110B and S/D contact plug 222, to result in a low contact resistance. SBH reduction layer 220 can have S, Te, and/or Se terminated bonds at the interface between SBH reduction layer 220 and S/D region 110B and can have transition metal terminated bonds at the interface between SBH reduction layer 220 and contact plug 222. These terminated bonds reduce SBH and reduce resistivity. For adequate reduction of SBH between S/D region 110B and contact plug 222, SBH reduction layer 220 can have a thickness T1 of about 0.5 nm to about 3 nm. In some embodiments, a ratio T1:W1 can be between about 0.017:1 and about 0.3:1.

In some embodiments, the TMC material of SBH reduction layer 220 can be formed from the diffusion of (i) a chalcogen material layer 702 (shown in FIG. 7A), such as a S, Se, and/or Te layer, and (ii) a transition metal layer 704 (shown in FIG. 7B), such as a W, Mo, Ti, Ta, Ni, Zr, and/or Co layer. Chalcogen material layer 702 can be deposited with, e.g., an atomic layer deposition (ALD) process with a pulse purge, or a chemical vapor deposition (CVD) process with a continuous gas supply. The precursor for depositing chalcogen material layer 702 can include S or Se powder/gas, hydrogen sulfide ($H_2S$) or hydrogen selenide ($H_2Se$), hydrogen disulfide ($H_2S_2$) or hydrogen diselenide ($H_2Se_2$), dithienodisilacyclohexadiene (DTDS), di-tert-butyl sulfide (DTBS), diethyl sulfide (DES), etc. The deposition can be plasma-enhanced, e.g., inductively coupled plasma (ICP), capacitively coupled plasma (CCP), microwave, electron cyclotron resonance (ECR) plasma, etc. The power of the plasma enhancement can be about 50 W to about 5000 W. The deposition temperature can be about 300° C. to about 800° C. with plasma enhancement or about 500° C. to about 1100° C. without plasma enhancement. The flow rate of the precursor gas (e.g., S- or Se-based gas) can be about 0.5 sccm to about 10 sccm. The flow rate of argon (Ar) or nitrogen ($N_2$) protective gas can be about 5 sccm to about 1000 sccm. The flow rate of $H_2$ plasma gas can be about 0 sccm to about 100 sccm. The pressure of the deposition chamber can be about 1 Torr to about 10 Torr. The deposition can last for a predetermined period of time based on growth rate and desired thickness of chalcogen material layer 702. Chalcogen material layer 702 can be a monolayer, bi-layers, or multiple layers. The thickness of chalcogen material layer 702 can be about 0.7 nm to about 2.1 nm.

Transition metal layer 704 can be deposited with e.g., an ALD process, a CVD process, a metal-organic chemical vapor deposition (MOCVD) process, molecular beam epitaxy (MBE), chemical vapor transport (CVT), etc. The precursors for depositing transition metal layer 704 can include a metal-based gas, e.g., tungsten trioxide ($WO_3$), molybdenum trioxide ($MoO_3$), titanium tetrachloride ($TiCl_4$), hafnium tetrachloride ($HfCl_4$), tetrakis(dimethylamino)titanium (TDMAT), tetrakis(dimethylamino)hafnium (TDMAHf), tungsten carbonyl ($W(CO)_6$), tungsten hexafluoride ($WF_6$), molybdenum hexafluoride ($MoF_6$), tungsten hexachloride ($WCl_6$), molybdenum pentachloride ($MoCl_5$), niobium pentachloride ($NbCl_5$), tantalum pentachloride ($TaCl_5$), etc. The deposition can be plasma-enhanced, e.g., inductively coupled plasma (ICP), capacitively coupled plasma (CCP), microwave, electron cyclotron resonance (ECR) plasma, etc. The power of the plasma enhancement can be about 50 W to about 5000 W. The deposition temperature can be about 300° C. to about 800° C. with plasma enhancement or about 500° C. to about 1100° C. without plasma enhancement. The flow rate of the metal-based gas can be about 0.5 sccm to about 10 sccm. The flow rate of Ar or $N_2$ protective gas can be about 5 sccm to about 1000 sccm. The flow rate of $H_2$ plasma gas can be about 0 to about 100 sccm. The pressure of the deposition chamber can be about 1 Torr to about 10 Torr. The deposition can last for a predetermined period of time based on growth rate and desired thickness of transition metal layer 704. Transition metal layer 704 can be a monolayer, bi-layers, or multiple layers. The thickness of transition metal layer 704 can be about 0.7 nm to about 2.1 nm.

Figure 2D:
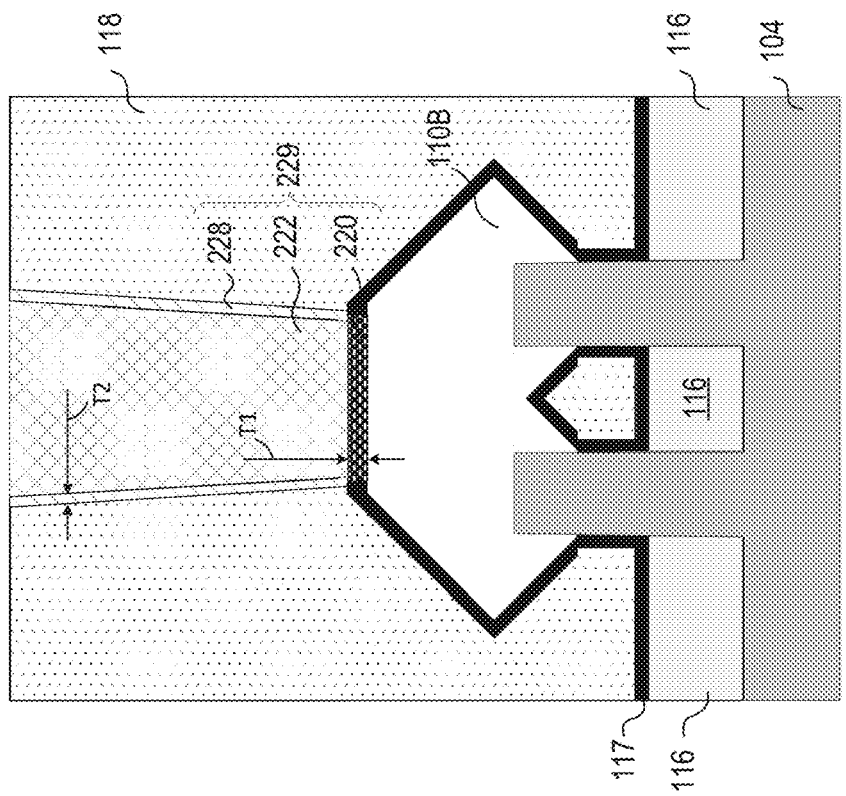
Figure 2C:
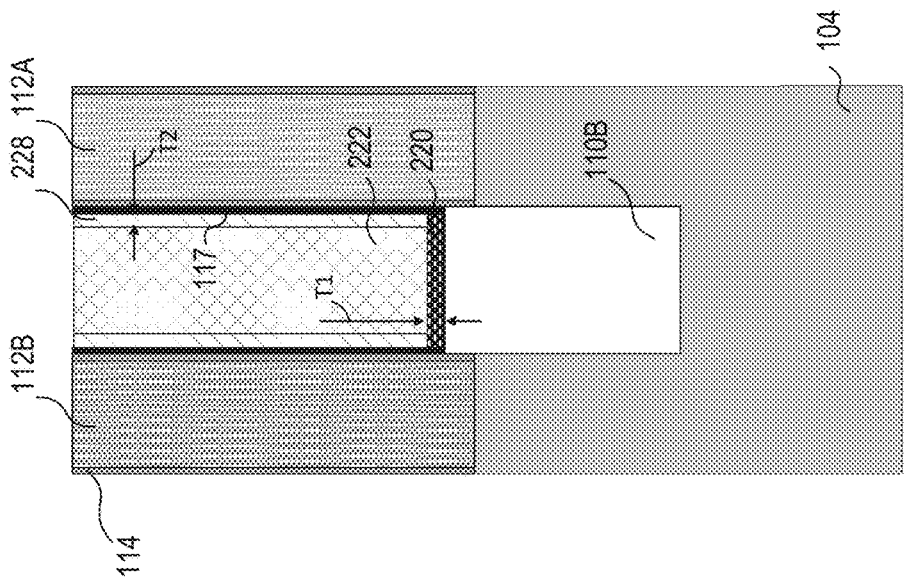

Referring to FIGS. 2C-2D, in some embodiments, FET 100 can include a S/D contact structure 229 instead of S/D contact structure 219. In some embodiments, S/D contact structure 229 can include SBH reduction layer 220 disposed on S/D region 110B, contact plug 222 disposed on SBH reduction layer 220, and a liner layer 228 (also referred to as barrier layer 228 or adhesion layer 228) disposed on sidewalls of contact plug 222. In some embodiments, liner layer 228 can include a TMC material similar to or different from SBH reduction layer 220, and can be formed in substantially the same process. In the embodiments where liner layer 228 can be substantially the same as the SBH reduction layer 220, the concentration of chalcogen material, e.g., S or Se can vary from about 2.1 at the top of liner layer 228 to about 1.6 at the bottom of liner layer 228. The variation can be caused by non-conformal plasma process. Non-conformal plasma process can also result in a shape of liner layer 228 to be triangular, thicker near the top of contact plug 222, and thinner near the bottom of contact plug 222. Conformal plasma process would also result in a uniform thickness of liner layer 228. Liner layer 228 can utilize high conductivity materials that will further reduce plug resistance. Liner layer 228 can also decrease elastic scattering between contact plug 222 and ILD layer 118 and improve conductivity. In some embodiments, liner layer 228 can have a thickness T2 of about 0.7 nm to about 2.1 nm. In some embodiments, a ratio T1:T2 can be about 1:1 to about 2:1. These dimension ranges and ratios of liner layer 228 provide adequate reduction of contact resistance and adequate adhesion of contact plug 222 with ILD layer 118 without compromising device size and manufacturing cost.

Figure 2F:
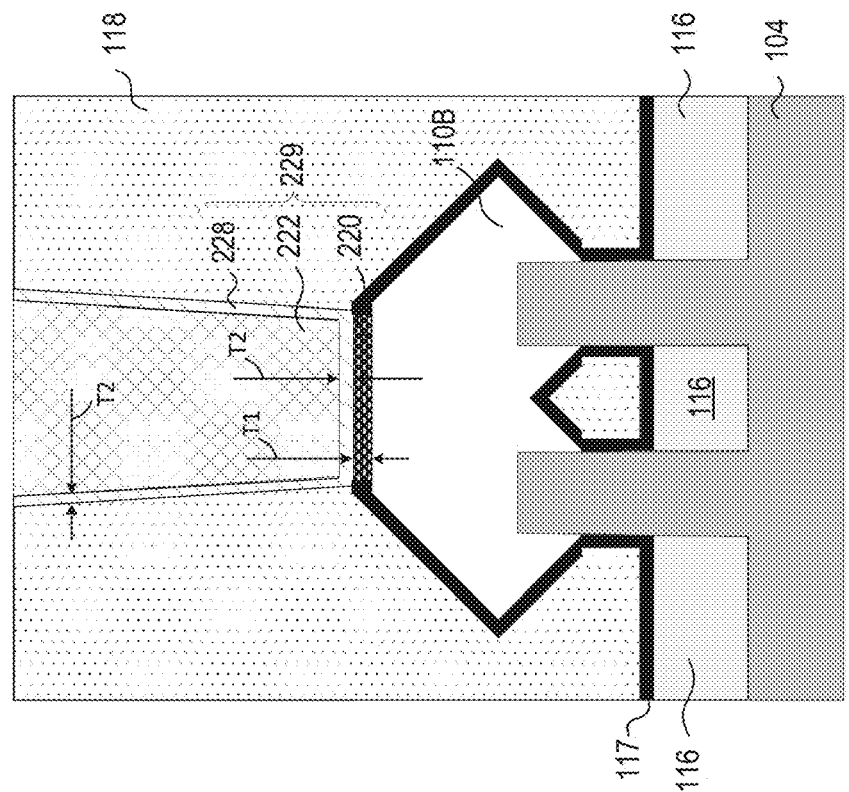
Figure 2E:
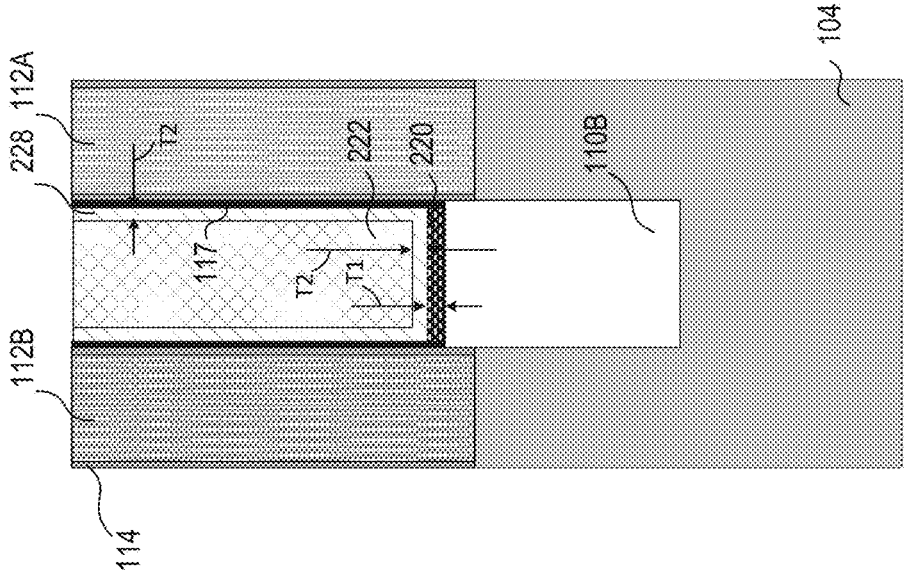

In some embodiments, liner layer 228 can be formed prior to the formation of SBH reduction layer 220 and as a result, liner 228 is not formed on SBH reduction layer 220, as shown in FIGS. 2C-2D. In some embodiments, liner layer 228 can be formed after the formation of SBH reduction layer 220, and as a result, liner 228 is formed on SBH reduction layer 220 and along sidewalls of contact plug 222, as shown in FIGS. 2E-2F.

Figure 2H:
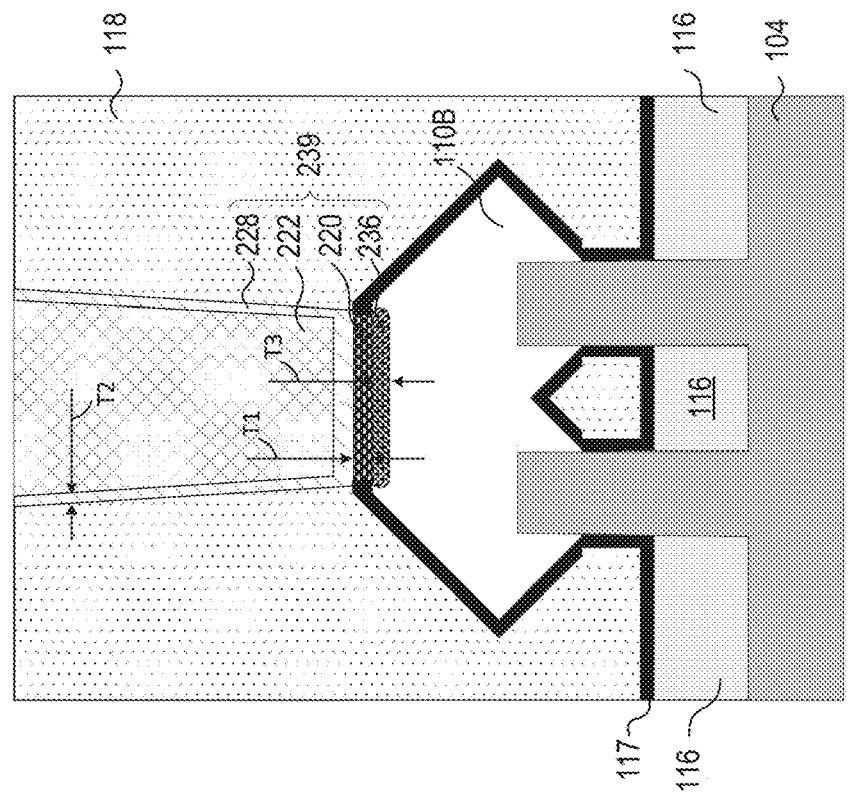
Figure 2G:
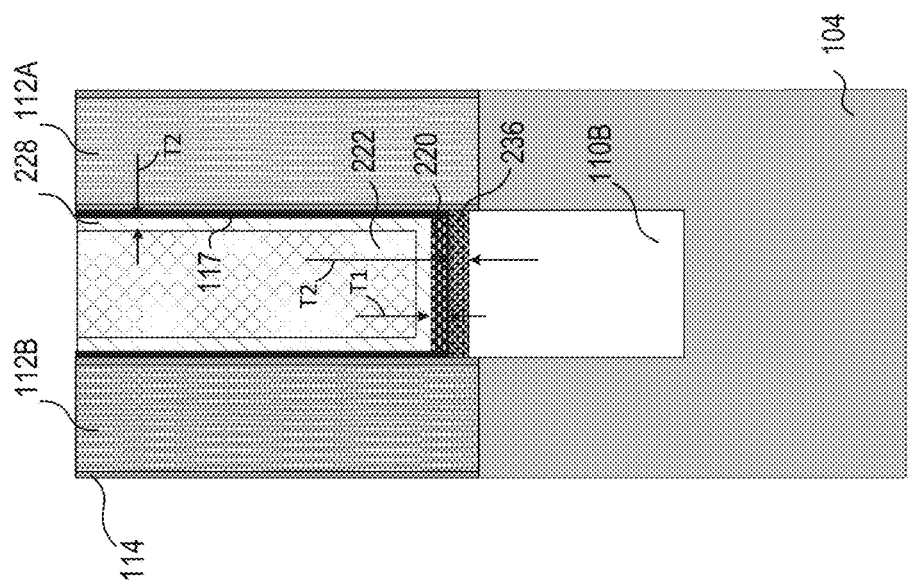

Referring to FIGS. 2G-2H, in some embodiments, FET 100 can include a S/D contact structure 239 instead of S/D contact structure 219 or 229. In some embodiments, S/D contact structure 239 can include a metal silicide layer 236 disposed within S/D region 110B, SBH reduction layer 220 disposed on metal silicide layer 236, liner 228 disposed on SBH reduction layer 220, and contact plug 222 disposed on liner layer 228. Metal silicide layer 236 can include Si, or SiGe, the dopants used on the top surface of epitaxial region 208, and the same metal as liner layer 228 or SBH reduction layer 220. Metal silicide structure 236 can further include S or Se. In some embodiments, metal silicide layer 236 can include Ti. Metal silicide structure 236 can be formed during the deposition of liner layer 228 or SBH reduction layer 220 at a temperature of about 400° C. to about 550° C. In some embodiments, metal silicide structure 236 can have a thickness T3 of about 0.5 nm to about 2.5 nm. In some embodiments, a ratio T1:T3 can be about 1:1 to about 1:2. Metal silicide layer 236 can further reduce the SBH between the S/D region 110B and contact plug 222, and thus reduce the contact resistance. Even though in FIGS. 2G-2H, metal silicide layer 236 is formed when liner layer 228 is formed on top of SBH reduction layer 220, metal silicide layer 236 can also be formed without liner layer 228 or with liner layer 228 on the sidewalls of contact plug 222.

Figure 2I:
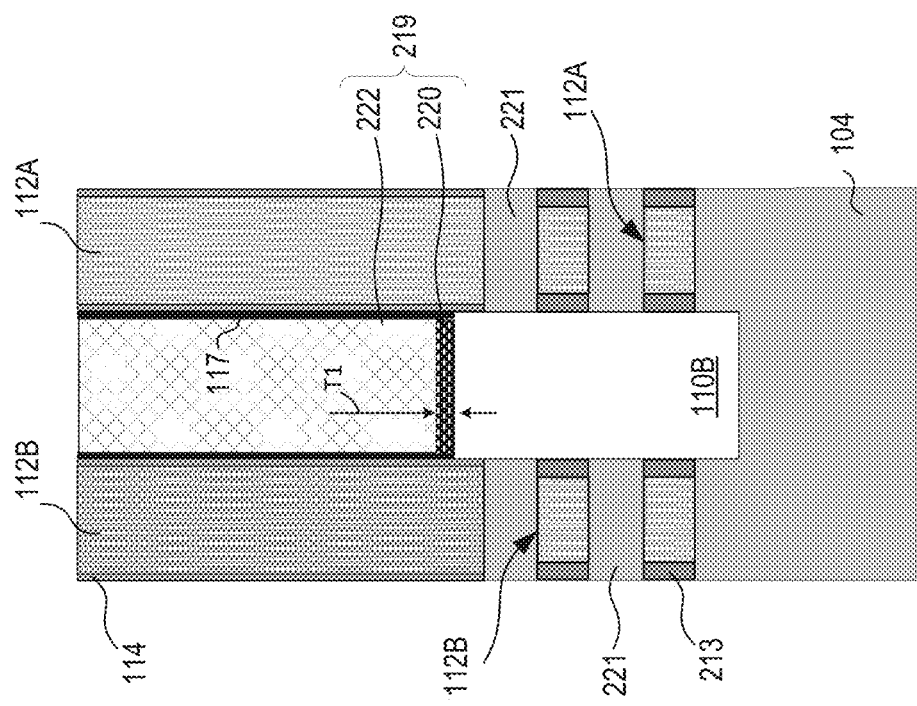

Referring to FIG. 2I, in some embodiments, FET 100 can be a GAA FET 100 instead of finFET 100 shown in FIGS. 2A-2H. For GAA FET 100, gate structures 112A-112B can have cross-sectional views as shown in FIG. 2I, instead of the cross-sectional views shown in FIGS. 2A, 2C, 2E, and 2G. Though GAA FET 100 in FIG. 2I is shown to have S/D contact structure 219, GAA FET 100 can have S/D contact structures 229 or 239, according to some embodiments. Gate structures 112A-112B of GAA FET 100 can be wrapped around nanostructured channel regions 221. Nanostructured channel regions 221 can be nanosheets or nanowires. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm are within the scope of the disclosure.

Nanostructured channel regions 221 can include semiconductor materials similar to or different from substrate 104. In some embodiments, nanostructured channel regions 221 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 221 are shown, nanostructured channel regions 221 can have cross-sections of other geometric shapes (e.g., circular, elliptical, triangular, or polygonal). Gate portions of gate structures 112A-112B surrounding nanostructured channel regions 221 can be electrically isolated from adjacent S/D regions 110B by inner spacers 113. Inner spacers 113 can include an insulating material, such as $SiO_x$, SiN, SiCN, SiOCN, and other suitable insulating materials.

Figure 3:
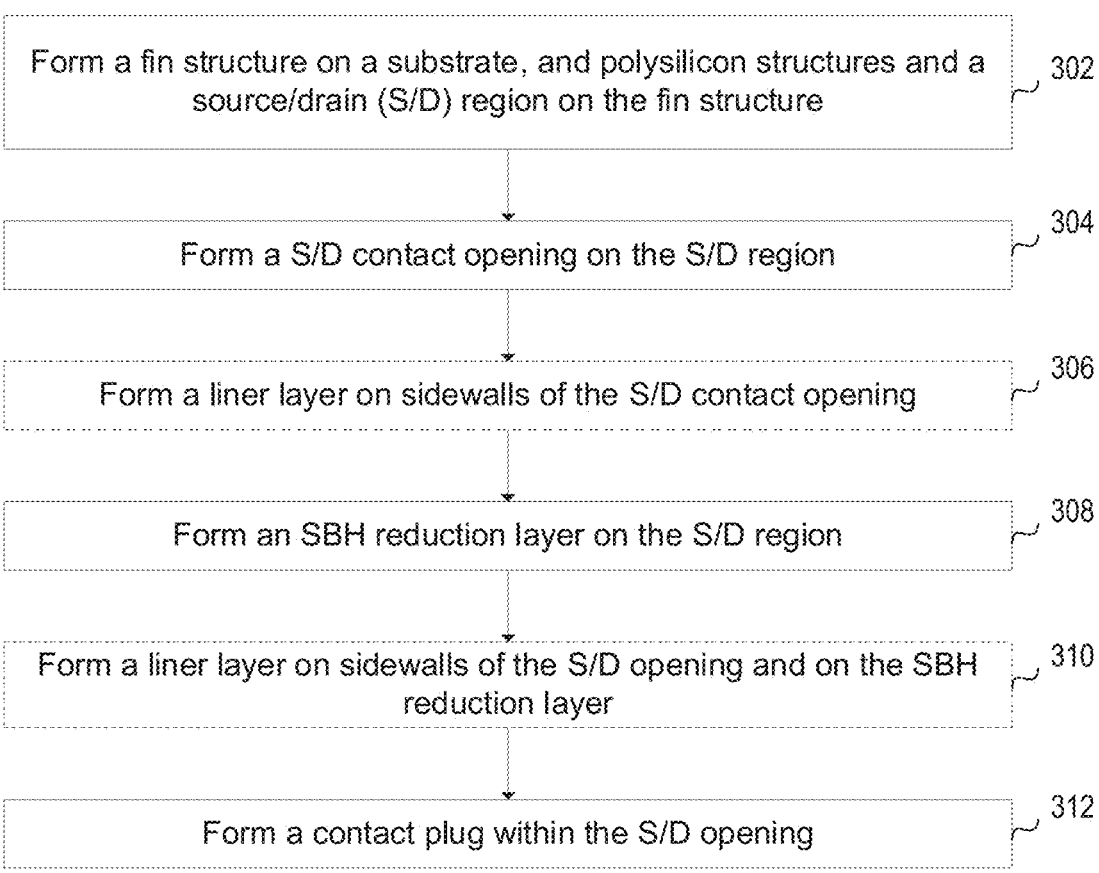
FIG. 3 is a flow diagram of a method for fabricating a semiconductor device with contact structures, in accordance with some embodiments.
Figure 4:
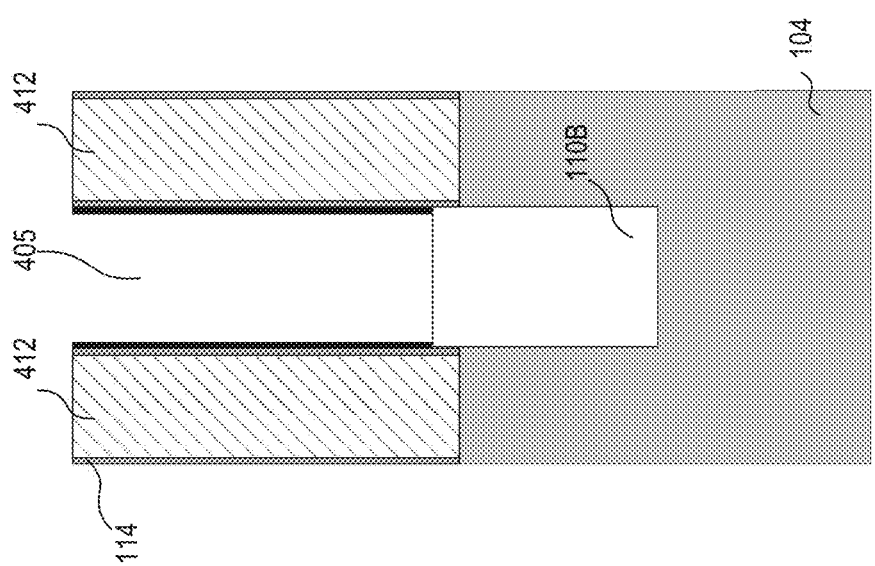

According to some embodiments, FIG. 3 is a flow diagram describing a method 300 for fabricating FET 100, as shown in FIGS. 1A and 2A-2H. For illustrative purposes, the operations illustrated in FIG. 3 will be described with reference to the example fabrication process for fabricating FET 100 as illustrated in FIGS. 4-5, 6A-6B, 7A-7C, 8A-8B, 9A-9C, 10A-10B, and 11A-12D. FIG. 4 is a cross-section view of FET 100 along line A-A of FIG. 1A at a stage of fabrication, according to some embodiments. FIGS. 5, 6A-6B, 7A-7C, 8A-8B, 9A-9C, 10A-10B, and 11A-12D are cross-sectional views of FET 100 along line B-B of FIG. 1A at various stages of fabrication, according to some embodiments. FIGS. 6A-6B, 7A-7C, 8A-8B, 9A-9C, 10A-10B, and 11A-12D are enlarged views of region 101 of FIG. 5. Additional fabrication operations can be performed between the various operations of method 300 and can be omitted for simplicity. These additional fabrication operations are within the spirit and the scope of this disclosure. Moreover, not all operations may be required to perform the disclosure provided herein. Additionally, some of the operations can be performed simultaneously, or in a different order than the ones shown in FIG. 3. It should be noted that method 300 may not produce a complete FET 100. Accordingly, it is understood that additional processes can be provided before, during, and after method 300, and that some other processes may only be briefly described herein. Elements in FIGS. 4-5, 6A-6B, 7A-7C, 8A-8B, 9A-9C, 10A-10B, and 11A-12D with the same annotations as elements in FIGS. 1A and 2A-2I are described above.

Figure 5:
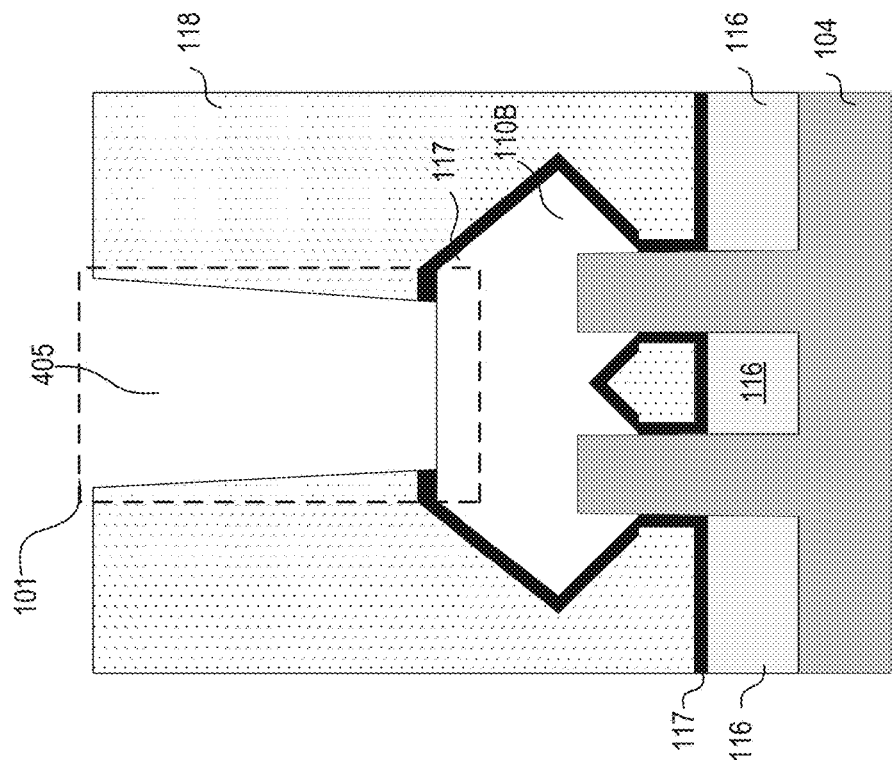

Referring to FIG. 3, in operation 302, a fin structure is formed on a substrate, and polysilicon structures and S/D regions are formed on the fin structure. For example, as shown in FIGS. 4-5, fin structure 106 is formed on substrate 104, and polysilicon structures 412 and S/D region 110B are formed on fin structure 106. ILD layer 118 and ESL 117 are formed after the formation of S/D region 110B.

Referring to FIG. 3, in operation 304, a S/D contact opening is formed on the S/D region. For example, as shown in FIGS. 4-5, a S/D contact opening 405 is formed on S/D region 110B. S/D contact opening 405 can be formed through ILD layer 118 and ESL 117. S/D contact opening 405 can be formed by patterned photoresist (not shown here). Photoresist layer can be patterned so that patterned photoresist structures are formed over ILD layer 118. Patterning of photoresist layer can be accomplished by exposing photoresist layer to UV or EUV light through a reticle (e.g., a photomask) and subsequently removing unexposed (or exposed portions) of the photoresist layer. The pitch (e.g., spacing) of patterned photoresist structures can vary depending on the pattern design. Therefore, high and low density areas of patterned photoresist structures (e.g., patterned photoresist structures with different pitch or spacing) can be formed over different areas of the ILD layer 118. The ILD layer 118 can be protected from the etching chemistry because photoresist layer can function as etching masks.

A dry etch process can remove ILD layer 118 and ESL 117 between patterned photoresist structures to form S/D contact opening 405. In other words, patterned photoresist structures can be used as an etch mask to define the geometrical aspects of S/D contact opening 405. For example, the width and the pitch of the patterned photoresist structures can be used to further define the width and the pitch of the resulting S/D contact opening 405. The bottom length (along a Y-axis) of S/D contact opening 405 can be about 10 nm to about 200 nm, the top length (along a Y-axis) of S/D contact opening 405 can be about 10 nm to about 200 nm and can be similar or different from the bottom length. The width (along an X-axis) of S/D contact opening 405 can be about 10 nm to about 30 nm. The height of S/D contact opening 405 can be about 20 to about 100 nm. The slant angle of S/D contact opening 405 can be about 80 degrees to about 90 degrees. In some embodiments, the sidewalls of the resulting S/D contact opening 405 can have a positive slope. However, this is not limiting, because S/D contact opening 405 can be designed to have substantially vertical sidewalls (e.g., between about 86° and about 90°), or sidewalls with a negative slope. The corners between the sidewalls and the bottom of S/D contact opening 405 are shown to be angular, but in some embodiments, the corners can be rounded. The sidewall slope (or sidewall angle) of S/D contact opening 405 can be tuned by the dry etch process conditions. Therefore, the dry etch process conditions can be adjusted to achieve the desired slope for the sidewalls of S/D contact opening 405. In some embodiments, the dry etch process can include several etch sub-steps with a different etch chemistry for each sub-step. After S/D contact opening 405 is formed, patterned photoresist structures can be removed with a wet clean process (e.g., wet strip).

The dry etch process (e.g., reactive ion etching process) can use a gas mixture having fluorocarbon ($C_xF_y$), nitrogen, and argon. The gas mixture can have about 10% to about 70% $C_xF_y$. The flow rate of $C_xF_y$ can range from about 100 sccm to about 400 sccm and the flow rate of nitrogen and argon can range from about 50 sccm to about 300 sccm. The etch process can be carried out for a period of time ranging from about 10 sec to about 90 sec at a temperature ranging from about 10° C. to about 90° C., under a pressure ranging from about 15 mTorr to about 100 mTorr. S/D contact opening 405 can be formed by a wet etch process, alternatively. The wet etch process can include a diluted solution of hydrofluoric acid (HF) with a buffer, such as ammonium fluoride ($NH_4F$), diluted HF ($HF/H_2O$), phosphoric acid ($H_3PO_4$), sulfuric acid with deionized water ($H_2SO_4/H_2O$), or any combinations thereof. The etching process can be a selective etch or a timed etch.

Referring to FIG. 3, in operation 306, a liner layer is formed on sidewalls of the S/D contact opening. For example, as described with reference to FIGS. 6A-6B, liner layer 228 is formed on sidewalls of S/D contact opening 405. In some embodiments, liner layer 228 can be formed on sidewalls of S/D contact opening 405 prior to the formation of SBH reduction layer 220. In some embodiments, liner 228 is not formed prior to the formation of SBH reduction layer 220 and operation 306 is not performed. In that case, operation 304 is followed by operation 308, and not by operation 306.

Figures 6A, 6B:
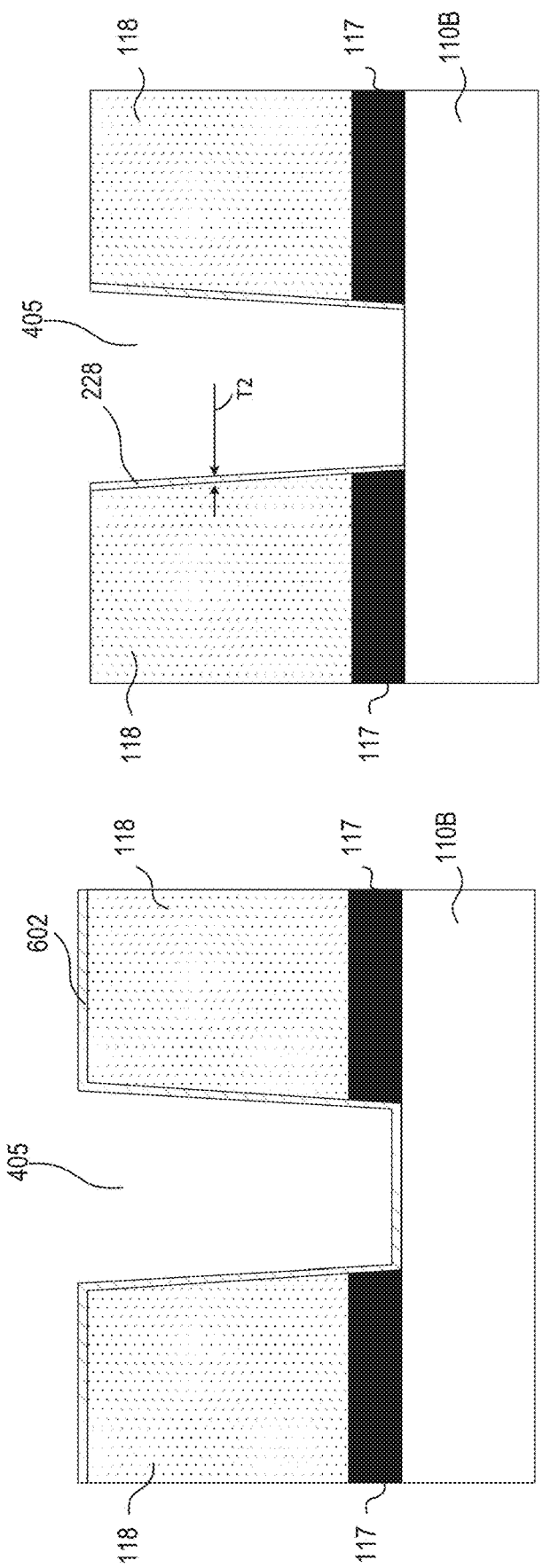

The formation of liner layer 228 on sidewalls of S/D contact opening 405 can include sequential operations of (i) depositing a metal layer (not shown) on the structure of FIGS. 4-5, (ii) treating the metal layer with a chalcogen material to form liner layer 602, as shown in FIG. 6A, and (iii) etching a portion of liner layer 602 that is on S/D region 110B to form liner layer 228, as shown in FIG. 6B.

The metal layer can include a transition metal (e.g., W, Co, Cu, Hf, Zr, Ti, etc.), a rare earth metal (e.g., Y, Yb, or Er), or combinations thereof. The metal layer can be deposited by sputtering, physical vapor deposition (PVD), CVD, plasma-enhanced chemical vapor deposition (PECVD), MOCVD. The precursors for depositing the metal layer can include a metal-based gas, e.g., $WO_3$, $MoO_3$, $TiCl_4$, $HfCl_4$, TDMAT, TDMAHf, $W(CO)_6$, $WF_6$, $MoF_6$, $WCl_6$, $MoCl_5$, $NbCl_5$, $TaCl_5$, etc. The deposition can be plasma-enhanced, e.g., ICP, CCP, microwave, ECR plasma, etc. The power of the plasma enhancement can be about 50 W to about 5000 W. The deposition temperature can be about 300° C. to about 800° C. with plasma enhancement or about 500° C. to about 1100° C. without plasma enhancement. The flow rate of the metal-based gas can be about 0.5 sccm to about 10 sccm. The flow rate of Ar or $N_2$ protective gas can be about 5 sccm to about 1000 sccm. The flow rate of $H_2$ plasma gas can be about 0 to about 100 sccm. The pressure of the deposition chamber can be about 1 Torr to about 10 Torr.

Treating the metal layer with a chalcogen material can include using a S- or Se-based gas, $H_2S$ or $H_2Se$, $H_2S_2$ or $H_2Se_2$, DTDS, DTBS, DES, etc. The treatment process can be plasma-enhanced, e.g., ICP, CCP, microwave, ECR plasma, etc. The power of the plasma enhancement can be about 50 W to 5000 W. The treatment temperature can be about 300° C. to about 800° C. with plasma enhancement or about 500° C. to about 1100° C. without plasma enhancement. The flow rate of the S- or Se-based gas can be about 0.5 sccm to about 10 sccm. The flow rate of Ar or $N_2$ protective gas can be about 5 sccm to about 1000 sccm. The flow rate of $H_2$ plasma gas can be about 0 sccm to about 100 sccm. The pressure of the processing chamber can be about 1 Torr to about 10 Torr.

In FIG. 6B, portions of liner layer 602 on top of ILD layer 118 and at the bottom of S/D contact opening 405 (i.e., on top of S/D region 110B) is removed, forming liner layer 228 on the sidewalls of S/D contact opening 405. Liner layer 602 on top of ILD layer 118 and on the bottom of S/D contact opening 405 can be removed by a selective dry etch. The selective dry etch can be directional, and can remove liner layer 602 from the horizontal plane but not from the vertical plane. In some embodiments, the directional dry etch can etch liner layer 602 in the vertical direction significantly more than in the horizontal direction. The dry etch process can be reactive ion etching process and can use a gas mixture having fluorocarbon ($C_xF_y$), nitrogen, and argon. In some embodiments, the etching process can be anisotropic—e.g., has a higher etching rate in the vertical direction (e.g., Z-axis) than in a lateral direction (e.g., X-axis and Y-axis). In some embodiments, the etching process can be a combination of chemical and physical etching. In some embodiments, the etching process can include multiple etching operations with different etching chemistries. The etchant(s) can be selected to have low selectivity towards ILD layer 118 and S/D region 110B and high selectivity towards the material of liner layer 602. The selectivity ratio between liner layer 602 and ILD layer 118 and S/D region 110B can be between about 2 and 10. By way of example and not limitation, the etching selectivity ratio between liner layer 602 and ILD layer 118 can be about 3:1 and the etching selectivity ratio between liner layer 602 and S/D region 110B can be about 10:1.

Referring to FIG. 3, in operation 308, an SBH reduction layer is formed within the S/D contact opening. For example, SBH reduction layer 220 can be formed on S/D region 110B after operation 304, as described with reference to FIGS. 7A-7C and 8A-8B, or can be formed on S/D region 110B after operation 306, as described with reference to FIGS. 9A-9C.

Figures 7A, 7B:
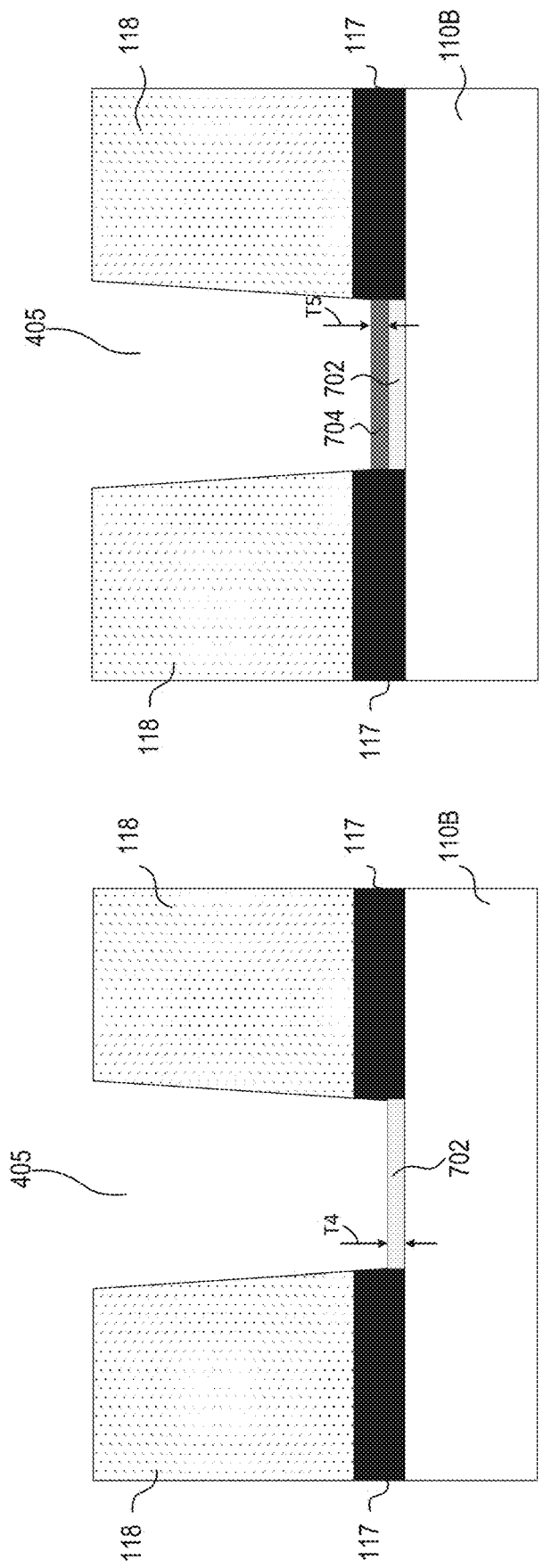
Figure 7D:
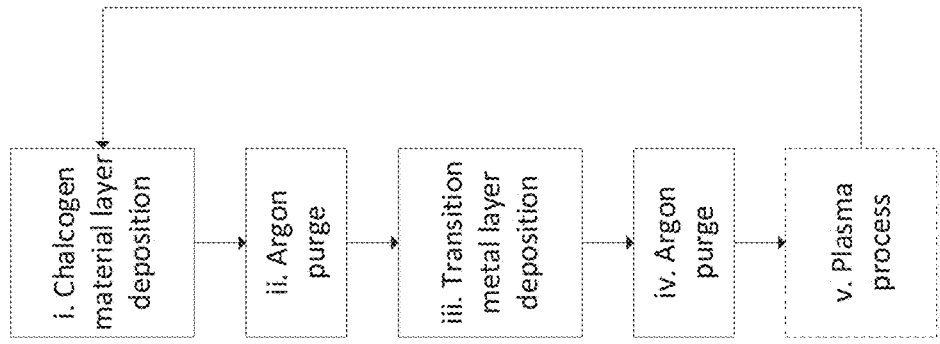
FIG. 7D illustrates a method for fabricating transition metal chalcogenide (TMC) layers, in accordance with some embodiments.
Figure 7C:
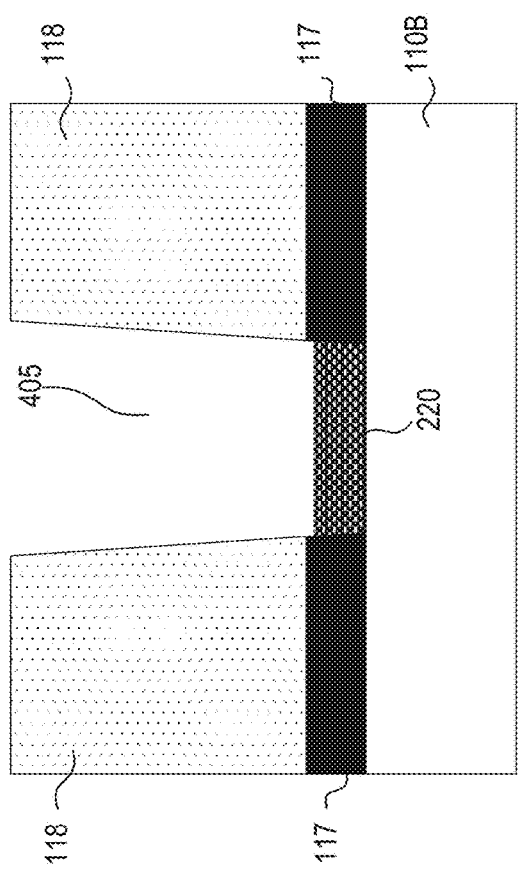

FIGS. 7A-7C illustrate one method of forming SBH reduction layer 220. Referring to FIG. 7D, in some embodiments, the formation of SBH reduction layer 220 can include sequential operations of (i) selectively depositing a chalcogen material layer 702 on S/D region 110B and not on ILD layer 118, as shown in FIG. 7A, (ii) purging the deposition chamber with argon (e.g., after ALD of chalcogen material layer 702), (iii) selectively depositing a transition metal layer 704 on chalcogen material layer 702 and not on ILD layer 118, as shown in FIG. 7B, and (iv) purging the deposition chamber with argon (e.g., after ALD of transition metal layer 704). In some embodiments, the formation of SBH reduction layer 220 can include (v) a plasma treatment with $H_2$ gas after the deposition of transition metal layer 704. The sequential operations (i)-(v) can be repeated to form multiple TMC layers.

Chalcogen material layer 702 such as a S, Se, and Te layer can be deposited with e.g., an ALD process or a CVD process. The precursor for depositing chalcogen material layer 702 can include S- or Se-based gas, S or Se powder/gas, $H_2S$ or $H_2Se$, $H_2S_2$ or $H_2Se_2$, DTDS, DTBS, DES, etc. The deposition can be plasma-enhanced, e.g., ICP, CCP, microwave, ECR plasma, etc. The power of the plasma enhancement can be about 50 W to about 5000 W. The deposition temperature can be about 300° C. to about 800° C. with plasma enhancement or about 500° C. to about 1100° C. without plasma enhancement. The flow rate of the S- or Se-based gas can be about 0.5 sccm to about 10 sccm. The flow rate of Ar or Na protective gas can be about 5 sccm to about 1000 sccm. The flow rate of the $H_2$ plasma gas can be about 0 sccm to about 100 sccm. The pressure of the deposition chamber can be about 1 Torr to about 10 Torr. Chalcogen material layer 702 can be deposited with a thickness T4 of about 0.7 nm to about 2.1 nm.

Transition metal layer 704 can be deposited with e.g., ALD, CVD, MOCVD, MBE, CVT, etc. The precursors for depositing transition metal layer 704 can include a metal-based gas, e.g., $WO_3$, $MoO_3$, $TiCl_4$, $HfCl_4$, TDMAT, TDMAHf, $W(CO)_6$, $WF_6$, $MoF_6$, $WCl_6$, $MoCl_5$, $NbCl_5$, $TaCl_5$, etc. The deposition can be plasma-enhanced, e.g., ICP, CCP, microwave, ECR plasma, etc. The power of the plasma enhancement can be about 50 W to about 5000 W. The deposition temperature can be about 300° C. to about 800° C. with plasma enhancement or about 500° C. to about 1100° C. without plasma enhancement. The flow rate of the metal-based gas can be about 0.5 sccm to about 10 sccm. The flow rate of Ar or Na protective gas can be about 5 sccm to about 1000 sccm. The flow rate of $H_2$ plasma gas can be about 0 sccm to about 100 sccm. The pressure of the deposition chamber can be about 1 to 10 Torr. Transition metal layer 704 can be deposited with a thickness T5 of about 0.7 nm to about 2.1 nm. A ratio T4:T5 can range from about 1:1 to about 1:2.

After the deposition of transition metal layer 704, chalcogen material layer 702 and transition metal layer 704 can diffuse to form the TMC material of SBH reduction layer 220, as shown in FIG. 7C. The diffused layers can comprise a composition of $M_xS_y$, $M_xSe_y$, $M_xTe_y$, etc., where M is a metal and the ratio between y value and x value can be about 1.2:1 to about 2.1:1. If the metal precursors contain O, Cl, or F, the atomic concentration of O, Cl, or F in the TMC material can be about 0% to about 30%. The atomic concentration of S or Se in the TMC material can be about 40% to about 66%. The atomic concentration of the transition metal in the TMC material can be about 20% to about 33%.

FIGS. 8A and 8B illustrate another method of forming SBH reduction layer 220. In some embodiments, the formation of SBH reduction layer 220 can include sequential operations of (i) selectively depositing a transition metal layer 704 on S/D region 110B and not on ILD layer 118, as shown in FIG. 8A, and (ii) treating transition metal layer 704 with a chalcogen material to form SBH reduction layer 220, as shown in FIG. 8B. The selective deposition of transition metal layer 704 on S/D region 110B can be performed in a manner similar to that described with reference to FIG. 7B.

Treating transition metal layer 704 with a chalcogen material can include using a S- or Se-based gas, $H_2S$ or $H_2Se$, $H_2S_2$ or $H_2Se_2$, DTDS, DTBS, DES, etc. The treatment process can be plasma-enhanced, e.g., ICP, CCP, microwave, ECR plasma, etc. The power of the plasma enhancement can be about 50 W to 5000 W. The treatment temperature can be about 300° C. to about 800° C. with plasma enhancement or about 500° C. to about 1100° C. without plasma enhancement. The flow rate of the S- or Se-based gas can be about 0.5 sccm to about 10 sccm. The flow rate of Ar or Na protective gas can be about 5 sccm to about 1000 sccm. The flow rate of $H_2$ plasma gas can be about 0 sccm to about 100 sccm. The pressure of the processing chamber can be about 1 Torr to about 10 Torr.

Figure 9C:
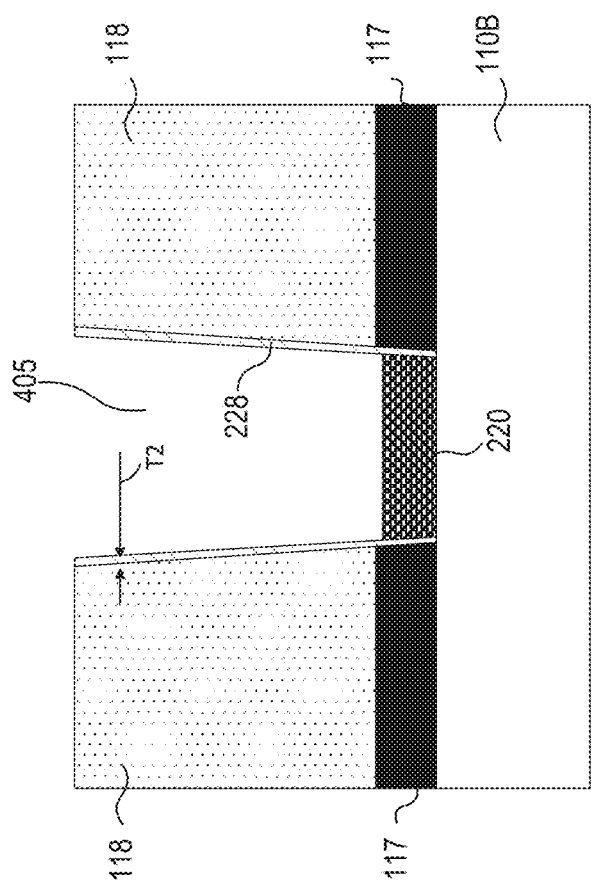
Figure 11D:
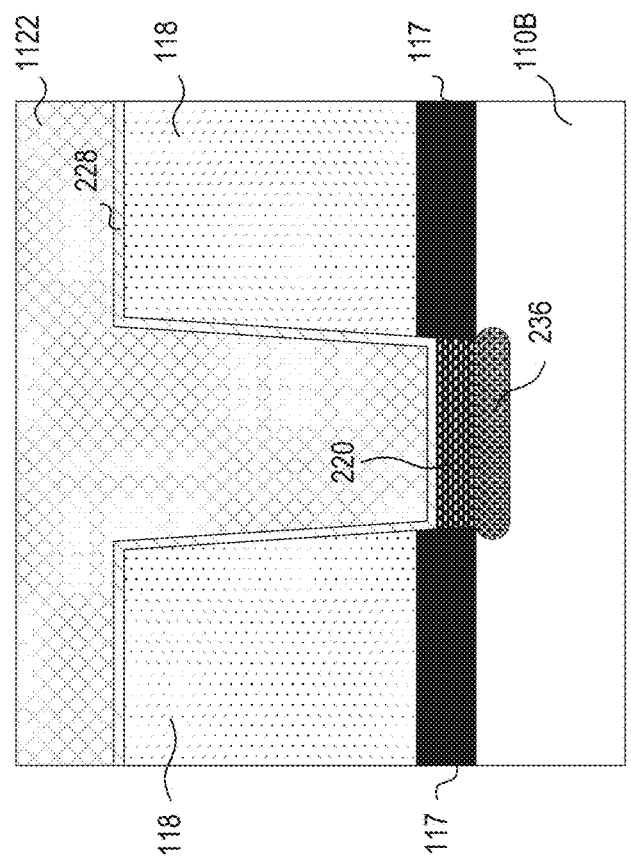
Figure 11C:
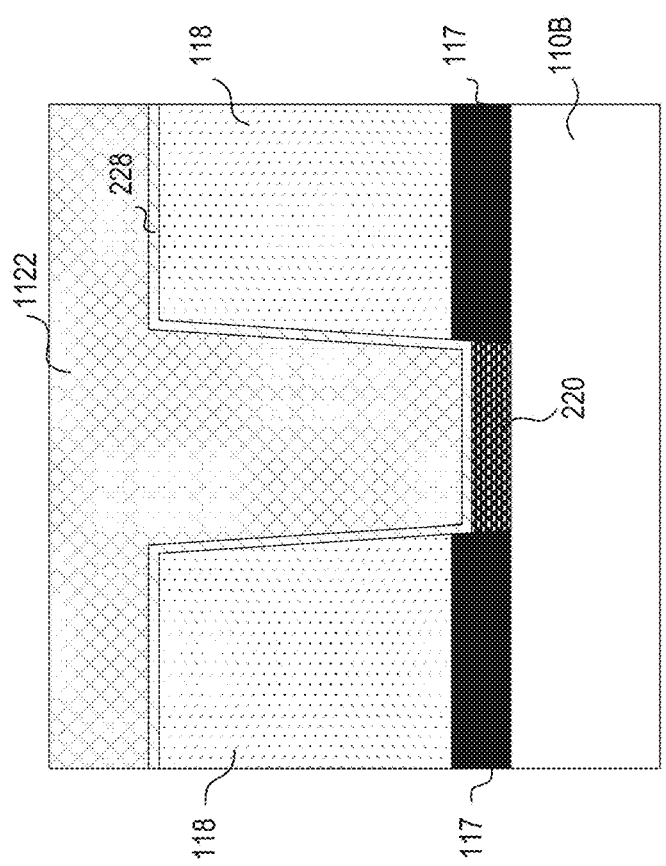
Figure 12D:
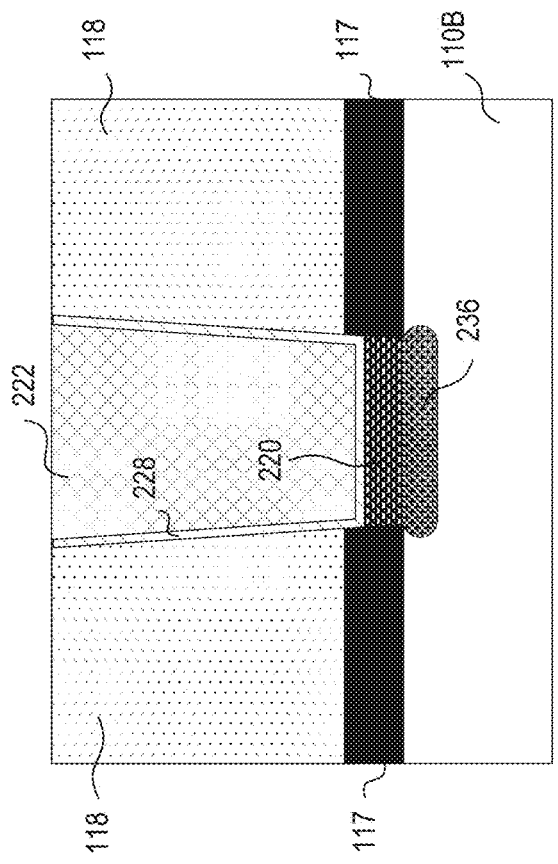
Figure 12C:
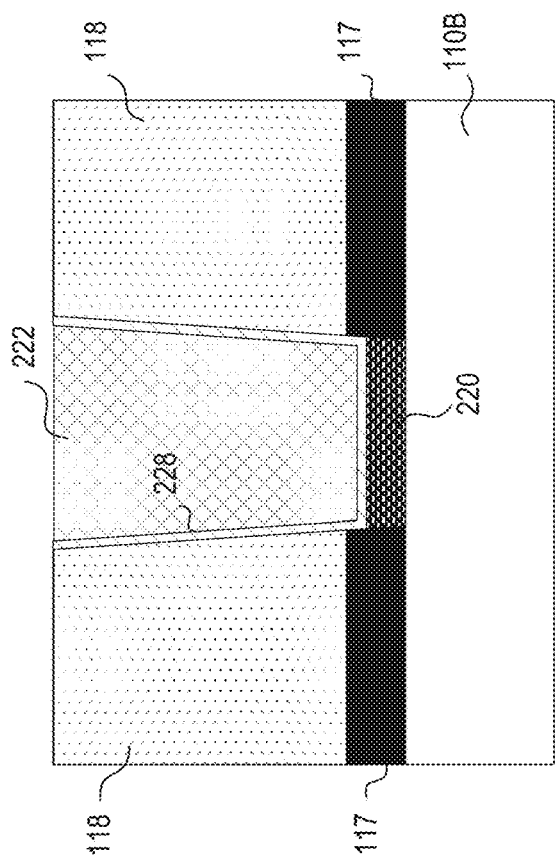

FIGS. 9A-9C illustrate the formation of SBH reduction layer 220 on the structure of FIG. 6B after operation 306, where the sidewalls of S/D contact opening 405 are covered with liner layer 228. Liner layer 228 can be disposed on the sidewalls of S/D contact opening 405 according to the method shown in FIGS. 6A and 6B. After liner layer 228 is formed on sidewalls of S/D contact opening 405, SBH reduction layer 220 can be formed in S/D contact opening 405 according to the method described with FIGS. 7A-7C or FIGS. 8A-8B.

Referring to FIG. 3, in some embodiments, operation 310 can be performed instead of operation 304. In some embodiments, operation 310 may not be performed and operation 308 can be followed by operation 312. In operation 310, a liner layer is formed on sidewalls of the S/D contact opening and on the SBH reduction layer. For example, as shown in FIG. 10A, liner layer 228 is formed on sidewalls of S/D contact opening 405 and on SBH reduction layer 220. Liner layer 228 can be formed on the structure of FIG. 7B or 8B. After SBH reduction layer 220 is formed in operation 308, liner layer 228 can be formed on SBH reduction layer 228 and on sidewalls of S/D contact opening 405. Liner layer 228 can be formed according to the method described with FIG. 6A in operation 304.

As shown in FIG. 10B, in some embodiments, a metal silicide layer 236 can be formed between SBH reduction layer 220, and S/D region 110B. The composition of metal silicide layer 236 can depend on the composition of SBH reduction layer 220 and/or on the composition of liner layer 228 because metal silicide layer 236 can be formed by a silicidation reaction between the material of S/D region 110B and a metal of SBH reduction layer 220 and/or of liner layer 228.

In some embodiments, metal silicide layer 236 can include Ti. Metal silicide layer 236 can be formed during the formation of liner layer 228 at a temperature of about 400° C. Metal silicide layer 236 can be formed with other metals at higher temperatures. Metal silicide layer 236 formed with this method can be thermally stable. Metal silicide layer 236 can be thermally stable n-type silicides on n-type S/D region 110B and can be thermally stable p-type silicides on p-type S/D region 110B.

Even though in FIG. 10B metal silicide layer 236 is formed when liner layer 228 is formed on top of SBH reduction layer 220, metal silicide layer 236 can also be formed without liner layer 228 or with liner layer 228 on the sidewalls of the S/D contact opening 405. SBH reduction layer 220 include metal, and at suitable temperatures, can react with silicon (Si) in S/D region 110B to form metal silicide layer 236.

Referring to FIG. 3, in operation, a contact plug is formed within the S/D contact opening. For example, as described with reference to FIGS. 11A-12D, contact plug 222 is formed within S/D contact opening 405. The formation of contact plug 222 can include sequential operations of (i) depositing a metal layer 1122 on the structures of FIG. 7C or 8B to form the structure of FIG. 11A, on the structure of FIG. 9C to form the structure of FIG. 11B, on the structure of FIG. 10A to form the structure of FIG. 11C, or on the structure of FIG. 10B to form the structure of FIG. 11D, and (ii) performing a chemical mechanical polishing (CMP) process on the structures of FIGS. 11A-11D to form the structures of FIGS. 12A-12D, respectively. In some embodiments, the formation of SBH reduction layer 220 and contact plug 222 are in-situ processes. In some embodiments, CMP can be used to remove the extra thickness of metal layer 1122 over ILD layer 118 so that the top surface of metal layer 1122 and ILD layer 118 can be substantially coplanar with each another.

The present disclosure provides example semiconductor devices (e.g., finFETs 100, GAA FET 100) with S/D contact structures (e.g., S/D contact structure 219, 229, and 239) having SBH reduction layers (e.g., SBH reduction layer 220) to achieve low contact resistance and a method (e.g., method 300) for forming such semiconductor devices. In some embodiments, the SBH reduction layers are disposed between S/D regions (e.g., S/D region 110B) and S/D contact plugs (e.g., S/D contact plug 222) to reduce contact resistance and eliminate the formation of metal silicide layer to reduce consumption of the material of S/D regions. In some embodiments, the SBH reduction layers include a TMC material.

In some embodiments, the SBH reduction layer can be formed by depositing a layer (e.g., layer 702) of chalcogen material e.g., S, Se, or Te, on the S/D region and then depositing a layer (e.g., layer 704) of transition metal, e.g., Ti, W, or Mo. The two layers can diffuse together and form the TMC material of the SBH reduction layer. The TMC layer can generate a gradient transition of semiconductor-semimetal-metal from the S/D region to the S/D contact plugs, thus reducing the SBH, i.e., SBH tuning.

In some embodiments, the SBH reduction layer can be formed by depositing a layer of transition metal, such as Ti, W, or Mo on the S/D region, and then treat the transition metal layer with a chalcogen material, such as S- or Se-based gas. In both methods of forming the SBH reduction layer, S or Se terminated bonds at the interface between the S/D region and the SBH reduction layer can reduce band gap and reduce resistivity. On the other hand, transition metal terminated bonds at the interface between the S/D contact plugs and the SBH reduction layer can reduce contact resistivity.

In some embodiments, a liner layer (e.g., liner layer 228) can be formed on sidewalls of the S/D contact plugs. In some embodiments, a liner layer can be formed on the SBH reduction layer. The liner layer can have conductive materials, e.g., $TiS_2$. The liner layer can decrease elastic scattering and improve conductivity. With the use of SBH reduction layers, thinner and higher-conductivity liners, and in some embodiments, metal silicides, the contact resistance can be reduced. The fabrication process for the SBH reduction layer can use a low temperature catalyst assisted growth, which reduces the challenges of the manufacturing process in achieving low contact resistance.

In some embodiments, a method includes forming a fin structure on a substrate, forming a gate structure on the fin structure, and forming a source/drain (S/D) region on the fin structure not covered by the gate structure. The method further includes forming a contact structure on the S/D region. Forming the contact structure includes forming a transition metal chalcogenide (TMC) layer on the S/D region, and forming a contact plug on the TMC layer.

In some embodiments, a method includes forming a fin structure on a substrate, forming a gate structure and a source/drain (S/D) region on the fin structure, and forming a contact structure on the S/D region. Forming the contact structure includes forming a contact opening on the S/D region, depositing a metal layer within the contact opening, performing a plasma process with a chalcogen material on the metal layer, and forming a contact plug within the contact opening.

In some embodiments, a semiconductor device includes a substrate, a fin structure disposed on the substrate, a gate structure disposed on the fin structure, a source/drain (S/D) region disposed on portions of the fin structure not covered by the gate structure, and a contact structure disposed on the S/D region. The contact structure includes a transition metal chalcogenide (TMC) layer disposed on the S/D region, and a contact plug disposed on the TMC layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin structure on a substrate;
   forming a gate structure on the fin structure;
   forming a source/drain (S/D) region on the fin structure not covered by the gate structure; and
   forming a contact structure on the S/D region, wherein forming the contact structure comprises:
   forming a liner layer on the S/D region;
   forming, after etching a portion of the liner layer from a top surface of the S/D region, a transition metal chalcogenide (TMC) layer comprising a bottom surface in contact with the top surface of the S/D region and a first sidewall in contact with a first portion of the liner layer; and
   forming a contact plug comprising a bottom surface in contact with a top surface of the TMC layer and a second sidewall in contact with a second portion of the liner layer.

2. The method of claim 1, wherein a ratio between a thickness of the TMC layer and a length of the TMC layer along the fin structure is between about 0.017:1 and about 0.3:1.

3. The method of claim 1, wherein forming the TMC layer comprises:
   depositing a layer of chalcogen material on the S/D region at a temperature between about 300° C. and about 800° C. with a plasma process or between about 500° C. and about 1100° C. without a plasma process; and
   depositing a layer of transition metal on the layer of chalcogen material at a temperature between about 300° C. and about 800° C. with a plasma process or between about 500° C. and about 1100° C. without a plasma process.

4. The method of claim 1, wherein forming the TMC layer comprises:
   depositing a layer of chalcogen material on the S/D region; and
   depositing a layer of transition metal on the layer of chalcogen material.

5. The method of claim 1, wherein forming the TMC layer comprises:
 forming a contact opening on the S/D region;
 depositing a layer of chalcogen material on the S/D region without depositing on sidewalls of the contact opening; and
 depositing a layer of transition metal on the layer of chalcogen material without depositing on sidewalls of the contact opening.

6. The method of claim 1, wherein forming the TMC layer comprises selectively depositing a layer of sulfur, selenium, or tellurium on the S/D region.

7. The method of claim 1, wherein forming the TMC layer comprises selectively forming a layer of sulfide, selenide, or telluride on the S/D region.

8. The method of claim 1, wherein a ratio between a thickness of the TMC layer and a thickness of the liner layer is between about 1:1 and about 2:1.

9. The method of claim 1, wherein forming the liner layer comprises forming a layer of transition metal chalcogenide material.

10. The method of claim 1, wherein forming the liner layer comprises forming a layer of tungsten sulfide, tungsten selenide, molybdenum sulfide, molybdenum selenide, or combinations thereof.

11. A method, comprising:
 forming a source/drain (S/D) region on a substrate;
 forming a gate structure on the substrate;
 depositing a dielectric layer on the S/D region;
 forming a contact opening in the dielectric layer to expose a top surface of the S/D region;
 forming a liner layer in the contact opening and on sidewalls of the dielectric layer;
 depositing, after removing a portion of the liner layer from the top surface of the S/D region, a chalcogen material layer on the top surface of the S/D region;
 depositing a metal layer on the chalcogen material layer; and
 forming a contact plug in the contact opening and on the liner layer.

12. The method of claim 11, wherein forming the liner layer comprises forming a layer of transition metal chalcogenide material.

13. The method of claim 11, wherein depositing the metal layer comprises depositing a layer of transition metal at a temperature between about 300° C. and about 800° C. with a plasma process.

14. The method of claim 11, wherein forming the liner layer comprises:
 depositing a transition metal layer on the top surface of the S/D region and on the sidewalls of the dielectric layer in the contact opening prior to depositing the chalcogen material layer; and
 exposing the transition metal layer to a chalcogen-based gas to form a transition metal chalcogenide layer on the top surface of the S/D region and on the sidewalls of the dielectric layer in the contact opening.

15. The method of claim 14, further comprising etching a portion of the transition metal chalcogenide layer on the top surface of the S/D region.

16. A method, comprising:
 forming first and second fin structures on a substrate;
 forming a gate structure on the substrate;
 forming a source/drain (S/D) region on the first and second fin structures;
 depositing a dielectric layer on the S/D region;
 forming an opening in the dielectric layer;
 forming a first transition metal chalcogenide (TMC) layer on a sidewall of the dielectric layer in the opening and on a top surface of the S/D region in the opening;
 removing a portion of the first TMC layer from the top surface of the S/D region;
 forming a second TMC layer on the top surface of the S/D region and in contact with the first TMC layer; and
 forming a contact plug on the first and second TMC layers.

17. The method of claim 16, wherein forming the first TMC layer comprises depositing a transition metal layer on the sidewall of the dielectric layer.

18. The method of claim 16, wherein forming the first TMC layer comprises forming a layer of sulfide, selenide, or telluride on the sidewall of the dielectric layer.

19. The method of claim 16, wherein forming the second TMC layer comprises:
 depositing a chalcogen material layer on the top surface of the S/D region; and
 depositing a transition metal layer on the chalcogen material layer.

20. The method of claim 11, further comprising performing a plasma treatment with a hydrogen gas on the metal layer.

* * * * *